(12) United States Patent
Aoki et al.

(10) Patent No.: US 6,794,973 B1
(45) Date of Patent: Sep. 21, 2004

(54) MAGNETIC FIELD GENERATING DEVICE FOR MRI

(75) Inventors: Masaaki Aoki, Takatsuki (JP); Shiego Hashimoto, Saga (JP)

(73) Assignee: Sumitomo Special Metals Co., Ltd., Osaka (JP)

(*) Notice: Subject to any disclaimer, the term of this patent is extended or adjusted under 35 U.S.C. 154(b) by 0 days.

(21) Appl. No.: 09/445,827

(22) PCT Filed: Apr. 13, 1999

(86) PCT No.: PCT/JP99/01944
§ 371 (c)(1),
(2), (4) Date: Aug. 1, 2000

(87) PCT Pub. No.: WO99/32427
PCT Pub. Date: Oct. 21, 1999

(30) Foreign Application Priority Data

Apr. 14, 1998 (JP) .......................................... 10-121781

(51) Int. Cl.[7] ................................................ H01F 5/00
(52) U.S. Cl. ...................................... 335/299; 335/216
(58) Field of Search ......................... 335/216, 296–301; 324/318–324

(56) References Cited

U.S. PATENT DOCUMENTS 4,818,966 A * 4/1989 Miyamoto et al. .......... 335/296
5,283,544 A * 2/1994 Sakurai et al. .............. 335/297
5,874,880 A * 2/1999 Laskaris et al. ............. 335/216

FOREIGN PATENT DOCUMENTS

| JP | 4-82536 | 3/1992 |
|----|---------|--------|
| JP | 4-138131 | 5/1992 |
| JP | 4-138132 | 5/1992 |
| JP | 5-144628 | 6/1993 |
| JP | 5-182821 | 7/1993 |
| JP | 8-31635 | 2/1996 |

* cited by examiner

*Primary Examiner*—Lincoln Donovan
(74) *Attorney, Agent, or Firm*—Dykema Gossett PLLC

(57) ABSTRACT

It is an object of the present invention to provide a magnetic field generator for MRI with which it is possible to lower the residual magnetism and eddy current within pole pieces generated by the effect of the pulse current flowing through Gradient magnetic field coils, without decreasing the field uniformity within the air gap. Pole pieces 40 in which a main component 41 consisting of laminated silicon steel sheets is effectively combined with a magnetic annular protrusion 42 disposed on the side on the main component 41 facing the air gap, the result of which is the formation of a static magnetic field having the desired uniformity within the air gap without leading to a state of magnetic saturation in the vicinity of the magnetic annular protrusion 42. This also makes possible a reduction in the residual magnetism and eddy current within the pole pieces 40 generated by the effect of the pulse current flowing through Gradient magnetic field coils.

6 Claims, 17 Drawing Sheets

Fig. 1 (a)
Fig. 1 (b)
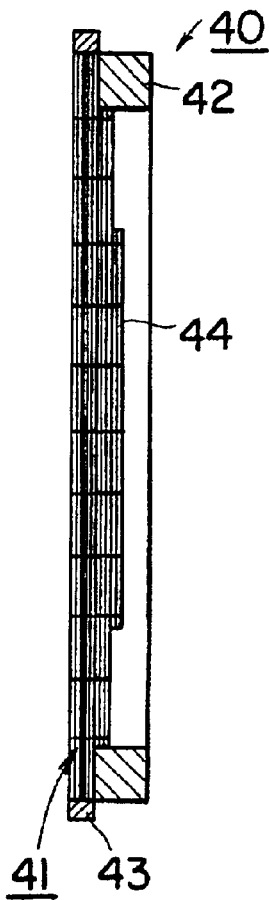
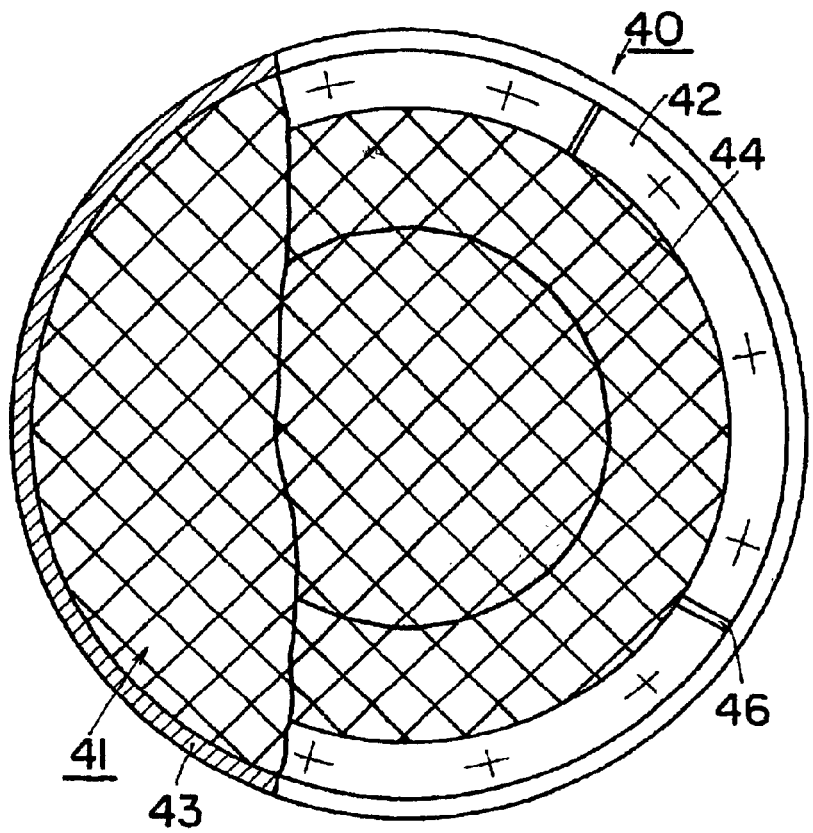
Fig. 1 (c)
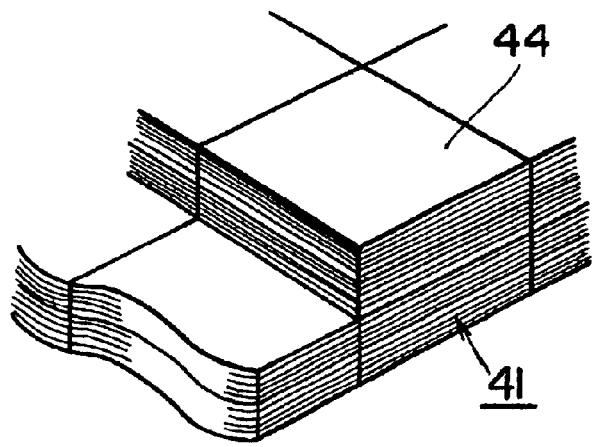

Fig. 5 (a)
Fig. 5 (b)
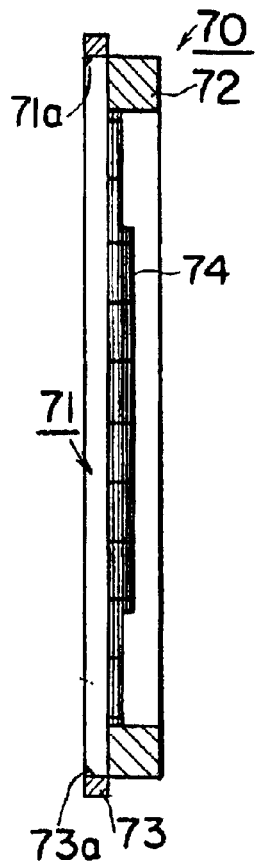
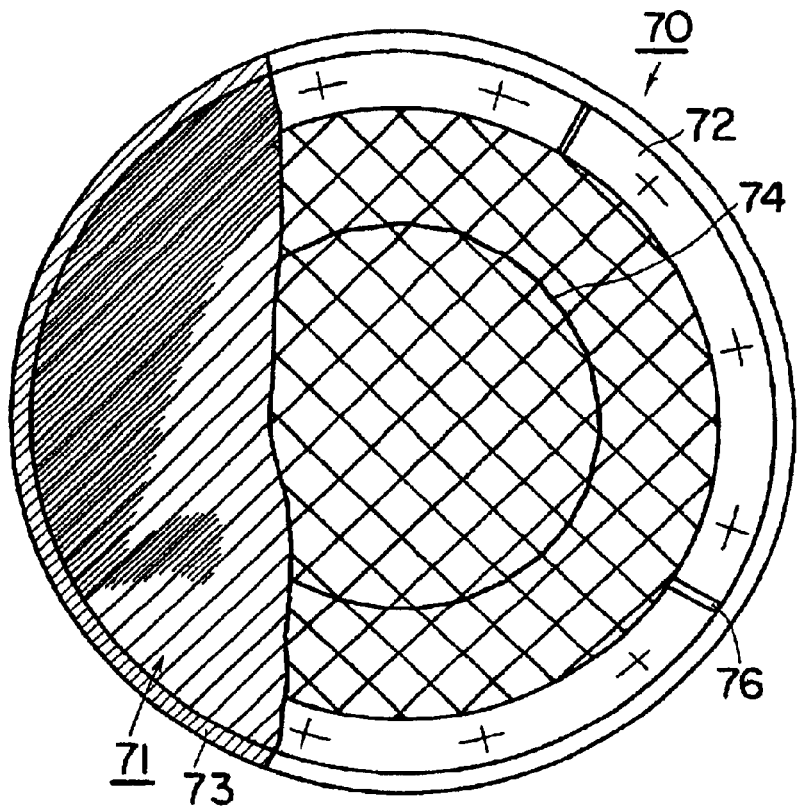
Fig. 5 (c)
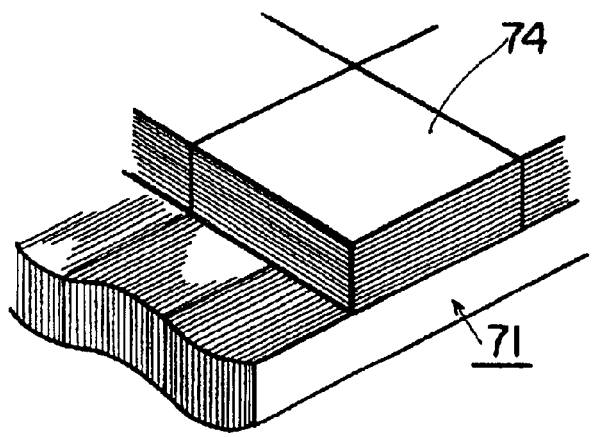

Fig. 17 (a)
Fig. 17 (b)
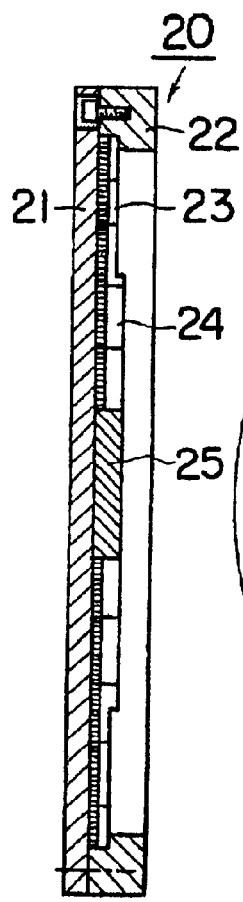
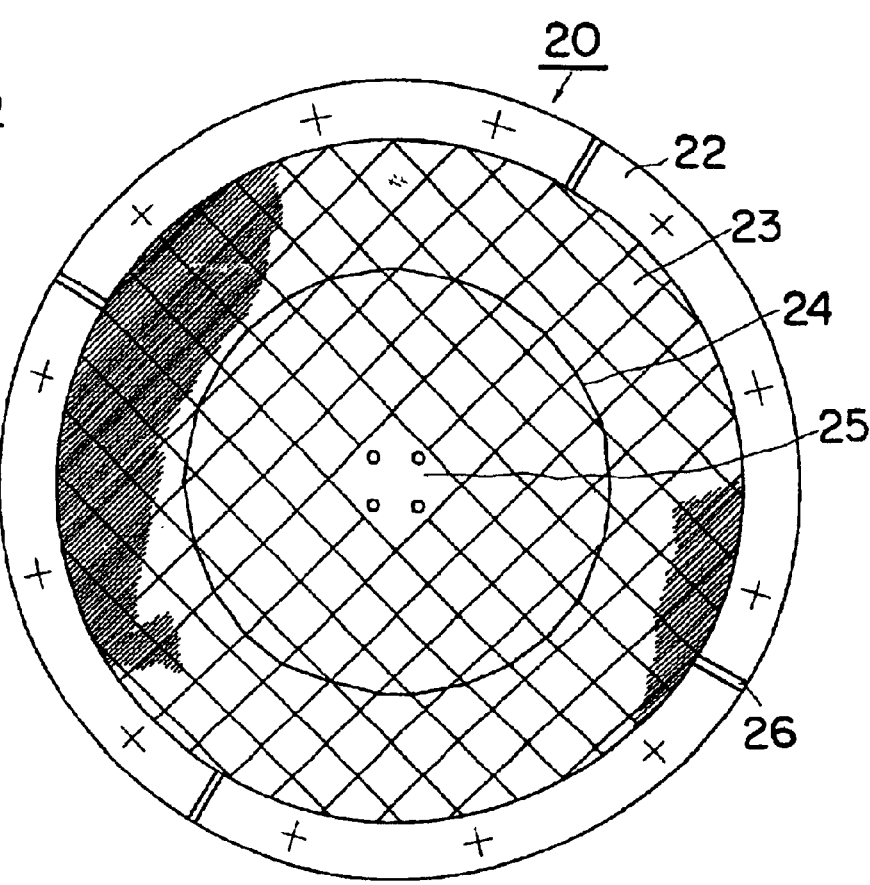
Fig. 17 (c)
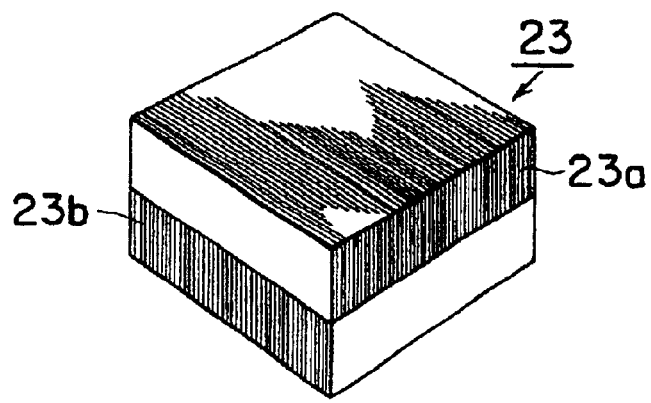

MAGNETIC FIELD GENERATING DEVICE FOR MRI

RELATED CASES

This application is related to PCT/JP/99/01944 filed Oct. 21, 1999.

TECHNICAL FIELD

The present invention relates to a magnetic field generator used in a medical-use magnetic resonance imaging (hereinafter referred to as MRI) device, and more particularly to an MRI magnetic field generator with reduced residual magnetism and eddy current generated by the effect of the pulse current flowing through Gradient magnetic field coils.

BACKGROUND ART

FIGS. 13(a) and (b) illustrate a known structure of an MRI magnetic field generator. In this structure, each of a pair of pole pieces 2 is fastened, with the pole pieces 2 facing each other, at one end of each of a pair of permanent magnet structures 1 comprising a plurality of block-shaped R-Fe-B-based magnets that have been integrated as the field generation source the other ends of the permanent magnet structures are connected to a yoke 3, and a static magnetic field is generated within the air gap 4 between the pole pieces 2.

In the figure, 5 is an annular protrusion formed in order to increase the uniformity of magnetic field distribution within the air gap 4, and another known structure is one in which a tiered protrusion (not shown) is formed on the inside of the annular protrusion in an effort to further increase the uniformity of the field distribution.

In the figure, 6 is a tilt field coil, which is disposed in order to obtain information about positioning within the air gap 4. These Gradient magnetic field coils 6 usually comprise a group of three coils corresponding to the three directions X, Y, and Z within the air gap 4, but are shown in simplified form in the figure.

With a structure such as this, the air gap 4 must be large enough for all or part of a patient's body to be inserted therein, and a static magnetic field having a high uniformity of $1 \times 10^{-4}$ or less at 0.02 to 2.0 T must be formed within a specified image field of view within the air gap 4.

With the structure shown in FIGS. 13(a) and (b), a so-called four-column yoke consisting of a pair of yoke plates 3a and 3b and four yoke columns 3c is used as the yoke 3, but as shown in FIGS. 14(a) and (b), variously structured yokes can be used according to the required characteristics, such as a so-called C yoke consisting of a pair of yoke plates 3a and 3b and a supporting yoke plate 3d.

With the structure shown in FIGS. 13(a) and (b), permanent magnets such as R-Fe-B-based magnets are employed as the field generation source, but other structures can also be used, such as one in which an electromagnetic coil is wound around the periphery of an iron core.

Regardless of which of these structures is used, the air gap 4 is formed by the pair of pole pieces 2, and Gradient magnetic field coils 6 are disposed in the vicinity of the pole pieces 2, as shown in FIGS. 13(a) and (b).

Usually, the pole pieces 2 are made from electromagnetic soft iron, pure iron, or another such bulk material (integrated), so when a pulse current is passed through the Gradient magnetic field coils 6 and a pulse-form tilt field is generated in the desired direction in order to obtain information about positioning within the air gap 4, the effect of this tilt field generates an eddy current in the pole pieces 2 and decreases the rise characteristics of the tilt field, and even after the flow of the pulse current has been halted, the uniformity of the field distribution in the air gap 4 is decreased by the residual magnetism generated in the pole pieces 2.

As a means for solving this problem, MRI magnetic field generators characterized in that the main portion of the pole pieces is formed from laminated silicon steel sheets have already been proposed by the inventors (Japanese Patent No. 2,649,436, Japanese Patent No. 2,649,437, U.S. Pat. No. 5,283,544, and European Patent No. 0479514).

The MRI magnetic field generators previously proposed by the inventors are chiefly characterized by the use of pole pieces structured as shown in FIGS. 16 to 18.

The structure of the pole piece 10 shown in FIGS. 15(a) and (b) comprises a soft iron magnetic ring having a rectangular cross-sectional shape and constituting an annular protrusion 12 on the air gap-facing side of a magnetic base member 11 composed of pure iron or another bulk material, and a plurality of laminated blocks 13 produced by laminating a plurality of silicon steel sheets in the facing direction of the pole pieces and integrating these with an insulating adhesive agent or the like.

In the figure, 14 is a tiered protrusion formed on the inside of the annular protrusion 12 for the purpose of enhancing the uniformity of the field distribution. Just as discussed above, a plurality of silicon steel sheets are laminated in the facing direction of the pole pieces and integrated with an insulating adhesive agent or the like, and the resulting plurality of laminated blocks are laminated in the required number.

15 in the figure is a soft iron core used for mounting the field generation coil.

16 in the figure is a slit formed in the radial direction for the purpose of dividing the soft iron magnetic ring having a rectangular cross-sectional shape and constituting the annular protrusion 12 into a plurality of sections in the circumferential direction and reducing the eddy current that is generated at the annular protrusion 12.

If the silicon steel sheets used in the above-mentioned laminated blocks 13 are directional silicon steel sheets (JIS C 2553, etc.), then from the standpoint of field distribution uniformity, it is preferable for them to be laminated and integrated such that the readily magnetizable axis direction (calendering direction) is rotated by 90 degrees every specific number of small blocks 13a and 13b as shown in FIG. 16(a). If the sheets are non-directional silicon steel sheets (JIS C 2552, etc.), then lamination and integration are performed merely in the thickness direction, without taking directionality into account, as shown in FIG. 16(b).

The structure of the pole pieces 20 shown in FIGS. 17(a) and (b) comprises a soft iron magnetic ring having a rectangular cross-sectional shape and constituting an annular protrusion 22 on the void-facing side of a magnetic base member 21 composed of pure iron or another bulk material, and a plurality of laminated blocks 23 produced by laminating a plurality of non-directional silicon steel sheets in the direction perpendicular to the facing direction of the pole pieces and integrating these with an insulating adhesive agent or the like.

In the figure, 24 is a tiered protrusion formed on the inside of the annular protrusion 22 for the purpose of enhancing the uniformity of the field distribution, 25 is a soft iron core used for mounting the field generation coil, and 26 is a slit that divides the soft iron magnetic ring having a rectangular cross-sectional shape and constituting the annular protrusion 22 into a plurality of sections in the circumferential direction.

It is preferable for the above-mentioned laminated blocks 23 to be laminated and integrated with an insulating adhesive agent or the like such that the lamination direction is rotated by 90 degrees for every one of the small blocks 23a and 23b laminated in the void-facing direction, as shown in FIG. 17(c).

The structure of the pole pieces 30 shown in FIGS. 18(a) and (b) is quite different from that of the pole pieces 10 and 20 shown in FIGS. 15 (a) and (b) and FIGS. 17(a) and (b), respectively, in that the magnetic base members 11 and 21 composed of a bulk material are not used. Specifically, this structure is such that, instead of the magnetic base members 11 and 21 composed of a bulk material, laminated rods 33, produced by laminating a plurality of non-directional silicon steel sheets, as shown in FIG. 18(c), in the direction perpendicular to the facing direction of the pole pieces and laminating these with an insulating adhesive agent or the like, are supported by an annular support member 34 composed of a bulk magnetic material.

To discuss this in more detail, the center portion of the annular support member 34 composed of a bulk magnetic material is cut out, and the above-mentioned laminated rods 33a are disposed unidirectionally suspended therein with the chamfers 38 thereof corresponding to the chamfers (not shown) formed around the inside edges of the cutout. The laminated rods 33b are laid out as a second layer such that the lamination direction is rotated by 90 degrees on the void-facing side of the laminated rods 33a.

A plurality of laminated rods 33c of different length are disposed between a fixed plate 35 and the inner peripheral surface of the annular support member 34 so that the overall shape of the pole piece will approximate that of a disk, and a soft iron magnetic ring having a trapezoidal cross section and constituting the annular protrusion 32 is installed via fixed blocks 31 fixed at specific positions around the outside edge of the inner periphery of the annular support member 34, forming the pole piece 30.

36 in the figure is a slit that divides the soft iron magnetic ring having a trapezoidal cross-sectional shape and constituting the annular protrusion 32 into a plurality of sections in the circumferential direction. 37 is an insulating material composed of an insulating adhesive tape or the like.

By using the pole pieces 10, 20, and 30 shown in FIGS. 15(a) and (b), 17(a) and (b), and 18(a) and (b) as above, is it possible to greatly reduce the generation of residual magnetism and eddy current in the pole pieces that is caused by the Gradient magnetic field coils as compared to when the conventional pole pieces composed of a bulk magnetic material shown in FIGS. 13(a) and (b) and 14(a) and (b) are used.

DISCLOSURE OF THE INVENTION

However, there is a growing need for an MRI magnetic field generator capable of producing sharp images at even higher speed, and further improvement is desired.

It has been confirmed in experiments conducted by the inventors that the structures of the above-mentioned pole pieces 10 and 20 in FIGS. 15(a) and (b) and 17(a) and (b) have numerous advantages, such as producing excellent mechanical strength (rigidity) for the pole piece as a whole because of the use of the magnetic base members 11 and 12 composed of a bulk material, and affording easy assembly work because of how easy it is to laminate and lay out the plurality of laminated blocks 13 and 23 produced by laminating silicon steel sheets in a specific direction and integrating these with an insulating adhesive agent or the like. Nevertheless, the very presence of these magnetic base members 11 and 21 prevents any further reduction in the residual magnetism and eddy current in the pole pieces.

Specifically, it has been confirmed that the magnetic field generated by the Gradient magnetic field coils goes from the laminated blocks 13 and 23 directly under the Gradient magnetic field coils, through the magnetic base members 11 and 21 on which these laminated blocks 13 and 23 are placed, and reaches the surface of the soft iron magnetic ring that constitutes the annular projection 12 and 22. Therefore, the magnetic base members 11 and 21 end up being present along the magnetic path between the laminated blocks 13 and 23 and the soft iron magnetic ring, and as a result an eddy current and residual magnetism are generated within the magnetic base members 11 and 21 composed of a bulk material.

With the pole pieces 30 structured as in FIGS. 18(a) and (b), the effective use of the annular support member 34 affords the same excellent mechanical strength and ease of assembly as the structures of the pole pieces 10 and 20 in FIGS. 15(a) and (b) and 17(a) and (b).

With this structure, no magnetic base members 11 and 21 composed of a bulk material, such as those used for the pole pieces 10 and 20 in FIGS. 15(a) and (b) and 17(a) and (b), are present under the laminated rods 33 directly beneath the Gradient magnetic field coils, which is preferable from the standpoint of reducing eddy current and residual magnetism, but because the annular support member 34 present under the laminated rods 33 is also composed of a bulk magnetic material, the result is that the required reduction in eddy current and residual magnetism cannot necessarily be achieved at the present time.

Furthermore, the void 39 is formed without the inner peripheral surface of the annular support member 34 being in complete contact with the laminated rods 33c, and as a result, the ratio (Sb/Sa) between the overall surface area Sa on the side of annular protrusion 32 facing the laminated silicon steel sheets and the overall surface area Sb on the side of the laminated silicon steel sheets facing the annular protrusion 32 is less than 80% (about 70 to 75%), resulting in a magnetically unsaturated state occurring where the annular protrusion 32 meets the laminated silicon steel sheets, and this sometimes impedes the flow of the magnetic flux to the annular protrusion 32 and makes it difficult to efficiently obtain a specific uniform magnetic field within the air gap between the pole pieces.

Specifically, the flux density produced by the magnetic field from the field generation source is far higher where the annular protrusion 32 meets the laminated silicon steel sheets than in other portions, and the laminated silicon steel sheets in contact with the annular protrusion 32 in particular need to have enough volume to avoid a magnetically unsaturated state. The inventors have confirmed, however, that the uniform magnetic field originally required for an MRI magnetic field generator cannot be obtained with the structure shown in FIGS. 18(a) and (b).

It is an object of the present invention to provide an MRI magnetic field generator that solves the above problems, and it is a further object to provide an MRI magnetic field generator with which it is possible to lower the residual magnetism and eddy current within pole pieces generated by the effect of the pulse current flowing through Gradient magnetic field coils, without decreasing the field uniformity within the air gap.

The inventors perfected the invention upon learning that the stated object can be effectively achieved by optimizing the disposition of the laminate of silicon steel sheets.

Specifically, the present invention is an MRI magnetic field generator that has a pair of pole pieces facing each other so as to form a air gap and that generates a magnetic field in this air gap, wherein the pole pieces each comprise a main component consisting of laminated silicon steel sheets, and a magnetic annular protrusion disposed on the side of the main component facing the air gap.

The inventors also propose as favorable structures a structure in which the main component consisting of laminated silicon steel sheets is fixed and supported by a non-magnetic support member with high electrical resistance; a structure in which the main component is fixed and supported by a magnetic annular support member divided into a plurality of sections in the circumferential direction; a structure in which the magnetic annular protrusion consists of laminated silicon steel sheets in order to reduce the eddy current generated in this annular protrusion; a structure in which the annular protrusion is divided into a plurality of sections in the circumferential direction; a structure in which a tiered protrusion comprising laminated silicon steel sheets is formed on the inside of the magnetic annular protrusion and on the side of the pole piece main component facing the air gap; and so on.

BRIEF DESCRIPTION OF THE DRAWINGS

FIG. 1 is a diagram illustrating the structure of the MRI magnetic field generator pertaining to the present invention, with (a) being a vertical cross section, (b) a top view, and (c) an oblique view of the main component;

FIG. 5 is a diagram illustrating another structure of the MRI magnetic field generator pertaining to the present invention, with (a) being a vertical cross section, (b) a top view, and (c) an oblique view of the main component;

FIG. 17 is a diagram illustrating another structure of a conventional MRI magnetic field generator, with (a) being a vertical cross section, (b) a front view, and (c) an oblique view of the laminated blocks.

BEST MODE FOR CARRYING OUT THE INVENTION

Figure 2:
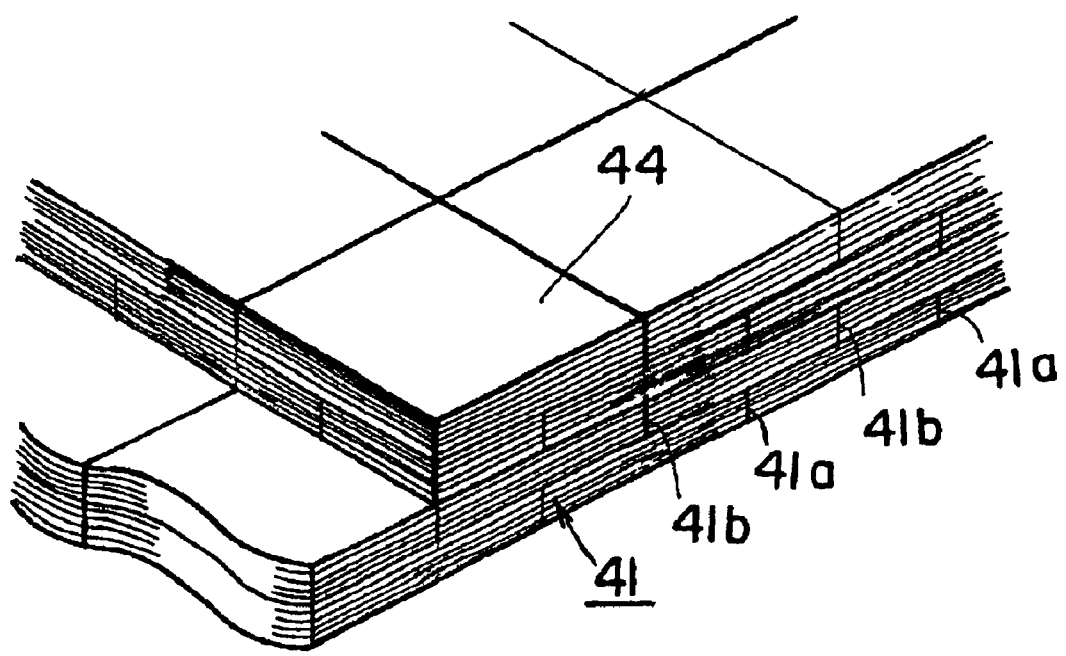
FIG. 2 is an oblique view of the main component, illustrating the structure of the MRI magnetic field generator pertaining to the present invention.

The present invention will now be described on the basis of the examples illustrated in FIGS. 1 to 12.

The pole piece 40 pertaining to the present invention and illustrated in FIGS. 1(a), (b), and (c) has as its main constituent members a main component 41 consisting of a plurality of laminated blocks fixed and supported by a non-magnetic annular support member 43 with high electrical resistance and produced by laminating a plurality of silicon steel sheets in the facing direction of the pole pieces and integrating these with an insulating adhesive agent or the like, and a magnetic annular protrusion 42 with a rectangular cross section and placed on the side of this main component 41 facing the air gap.

For the main component 41, a plurality of laminated blocks consisting of silicon steel sheets are first integrated into a rectangular sheet shape, after which the outer periphery is worked into a specific shape by water jet working, laser working, machining, discharge working, or the like so that the overall shape approximates that of a disk. The main component 41 is fixed and supported by disposing a non-magnetic annular support member 43 with high electrical resistance and composed of a resin, bakelite, FRP, or another such non-metal around its peripheral edge. It is also possible to ensure good mechanical strength by using an epoxy resin or the like to mold the plurality of laminated blocks and the non-magnetic annular support member 43.

Another option, for the purpose of increasing the uniformity of the field distribution in the air gap, is to provide a tiered protrusion 44 consisting of laminated silicon steel sheets that have been worked into the above-mentioned approximate disk shape and formed on the inside of the magnetic annular protrusion 42 and on the side of the laminated silicon steel sheets facing the air gap. This tiered protrusion 44 is also constituted by a plurality of laminated blocks produced by laminating a plurality of silicon steel sheets in the facing direction of the pole pieces and integrating these with an insulating adhesive agent or the like.

In the figure, the tiered protrusion 44 is structured such that the above-mentioned laminated blocks are laid over the entire surface on the inside of the magnetic annular protrusion 42, and the thickness of the center portion in the pole piece facing direction in particular is increased to achieve an overall tiered shape, but it is also effective for the laminated blocks to be laid only in the center portion, and not provided near the inside of the magnetic annular protrusion 42.

In the present invention, the "main component consisting of laminated silicon steel sheets" refers to the portion facing the tilt field coil, including the tiered protrusion 44. The provision of a tiered protrusion will also be described for the structure of the pole pieces described below, but this tiered protrusion is not essential in the present invention. Specifically, other structures may also be employed to achieve an increase in uniformity of the field distribution within the air gap rather than providing a tiered protrusion, such as disposing yokes, permanent magnets, or the like at specific positions on the side (flat side) of the abovementioned approximately disk-shaped Laminated silicon steel sheets facing the air gap.

Figure 16:
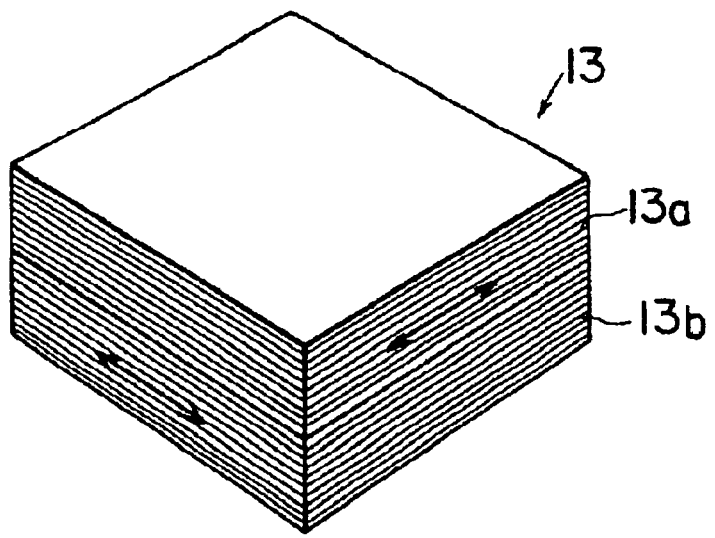
FIGS. 16(a) and (b) are oblique views of the laminated blocks used in a conventional URI magnetic field generator.
Figure 16:
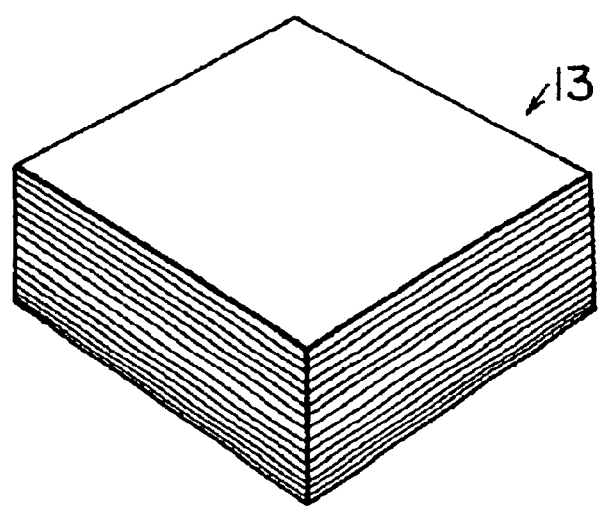
Figure 18:
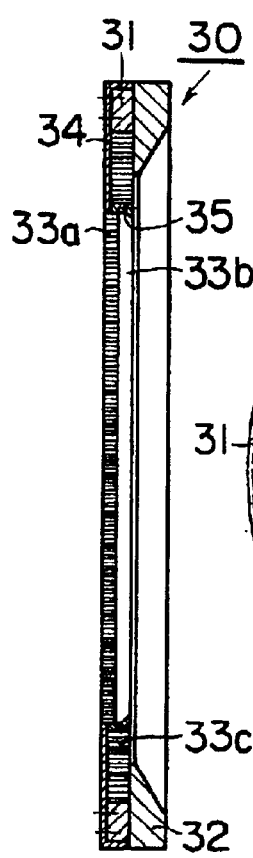
FIG. 18 is a diagram illustrating another structure of a conventional MRI magnetic field generator, with (a) being a vertical cross section, (b) a front view, and (c) an oblique view of the laminated rods.
Figure 18:
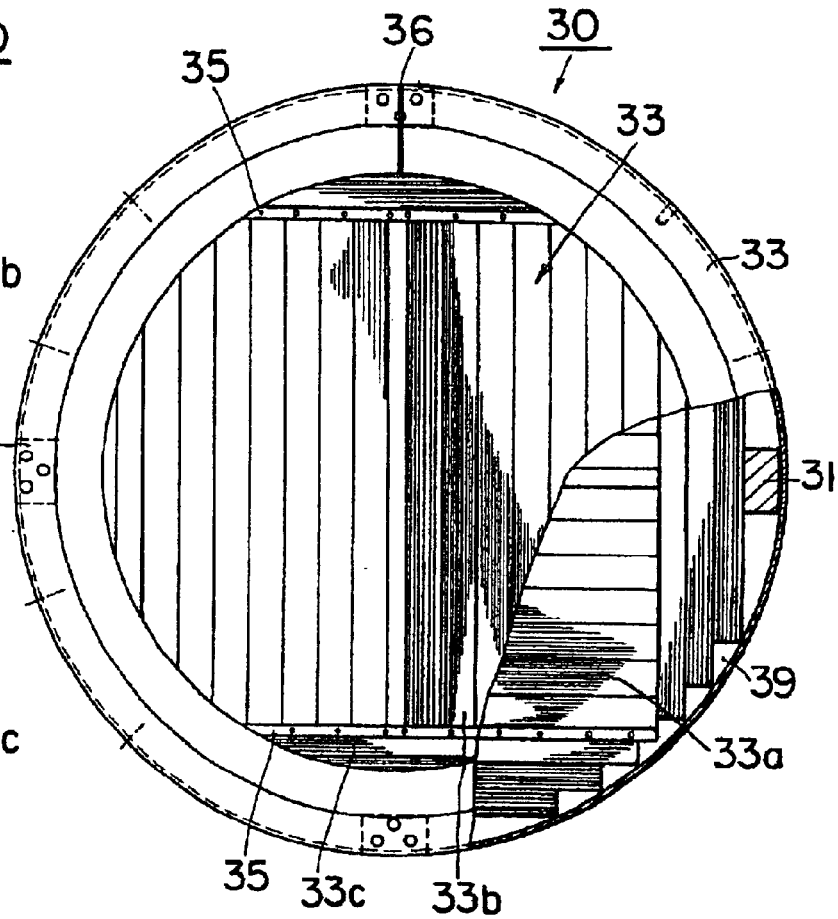
Figure 18:
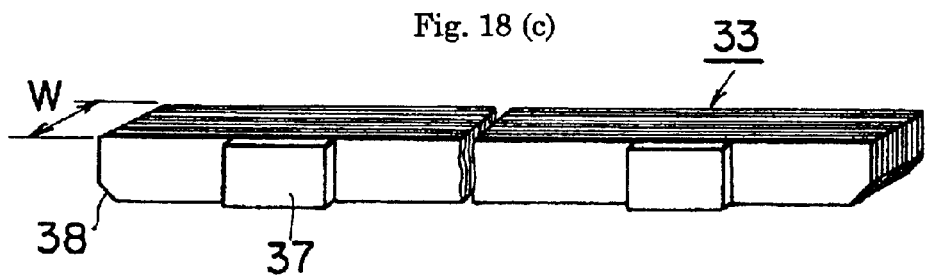

FIG. 1(c) is an oblique view illustrating the relationship of the lamination direction of the laminated blocks of silicon steel sheets that constitute the main component 41. As previously described, if the silicon steel sheets used in these laminated blocks are directional silicon steel sheets (JIS C 2553, etc.), then from the standpoint of field distribution uniformity, it is preferable for them to be laminated and integrated such that the readily magnetizable axis direction (calendering direction) is rotated by 90 degrees every specific number of small blocks as shown in FIG. 16(a). In the case of non-directional silicon steel sheets (JIS C 2552, etc.), then lamination and integration are performed merely in the thickness direction, without taking directionality into account, as shown in FIG. 16(b).

As shown in FIG. 2, a further reduction in the effect of residual magnetism or eddy current due to the Gradient magnetic field coils can be achieved by disposing connecting end (side) faces 41a and 41b of the laminated blocks of adjacent silicon steel sheets so that these faces do not line up in the lamination direction of the various laminates.

Specifically, if there is leakage of the magnetic field generated by the Gradient magnetic field coils from the gaps that are inevitably formed at the connecting end faces of the various laminated blocks, and if this leaked magnetic field acts on the permanent magnet structure that serves as the field generation source, then an eddy current, albeit a very slight one, will be generated on the permanent magnet structure surface, and the field distribution uniformity within the air gap will become unstable due to heat generation and the like caused by this eddy current.

However, as shown in FIG. 2, if the various connecting end faces of the laminated blocks of silicon steel sheets are disposed so that they do not line up, then a magnetic path will be formed within the air gap without a substantial increase in magnetic permeability (decrease in magneto resistance) in the direction perpendicular to the lamination direction of the laminated blocks (i.e., the horizontal direction in the figure), and without the magnetic field generated by the Gradient magnetic field coils infiltrating the permanent magnet structure.

Similarly, with the pole pieces described below, it is favorable to employ the same structure for the disposition of the various connecting end faces of the laminated blocks of silicon steel sheets.

In the figure, 46 is a slit that divides the soft iron magnetic ring having a rectangular cross section and constituting the magnetic annular protrusion 42 into a plurality of sections in the circumferential direction, and that is formed in the radial direction for the purpose of reducing the eddy current generated within the magnetic annular protrusion 42.

Figure 8:
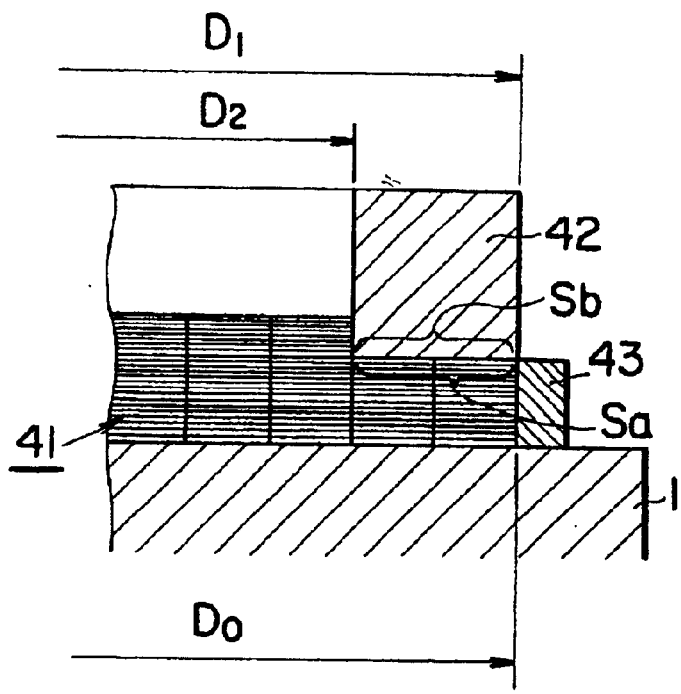
FIG. 8 is a vertical cross section illustrating a detail view of the MRI magnetic field generator pertaining to the present invention.

The relationship between the main component 41 and the magnetic annular protrusion 42 in the above structure will be described in detail through reference to FIG. 8. The laminated silicon steel sheets that constitute the main component 41 are formed in an approximate disk shape, and the outside diameter $D_0$ thereof is roughly the same as the outside diameter $D_1$ of the magnetic annular protrusion 42. Therefore, the side of the magnetic annular protrusion 42 facing the main component 41 is in contact with the laminated silicon steel sheets.

It is therefore possible for the originally required field intensity to be efficiently generated in the specified air gap of the MRI magnetic field generator without the magnetic flux produced by the magnetic field from the permanent magnet structure 1 serving as the field generation source leading to a magnetically unsaturated state where the laminated silicon steel sheets and the magnetic annular protrusion 42 touch.

Also, in the main component 41, the bulk magnetic material is not disposed either directly below or to the inside of the inside diameter $D_2$ of the magnetic annular protrusion 42. Specifically, since no bulk magnetic material is disposed in the vicinity of directly below the Gradient magnetic field coils, it is possible to obtain the desired reduction in eddy current and residual magnetism.

The outside diameter $D_0$ of the laminated silicon steel sheets constituting the main component 41 is not limited to being the same as the outside diameter $D_1$ of the magnetic annular protrusion 42 as shown in the figure. For instance, it is also possible for this diameter $D_0$ to be larger than the outside diameter $D_1$ of the magnetic annular protrusion 42, but making it unnecessarily large is undesirable because this will increase leakage of the magnetic flux from the outer periphery of the laminated silicon steel sheets.

It is also possible for the outside diameter $D_0$ of the laminated silicon steel sheets to be smaller than the outside diameter $D_1$ of the magnetic annular protrusion 42, but making it unnecessarily small will lead to a magnetically unsaturated state where the laminated silicon steel sheets and the magnetic annular protrusion 42 touch, so it is preferable for the ratio (Sb/Sa) between the overall surface area Sa on at least the side of the magnetic annular protrusion 42 facing the laminated silicon steel sheets and the overall surface area Sb on the side of the laminated silicon steel sheets facing the magnetic annular protrusion 42 to be at least 80%, with 85% or more being preferable, and 90% or more being even better. The figure illustrates a case of 100% (Sa=Sb).

The figure illustrates a structure in which the non-magnetic annular support member 43 is disposed on the outside of the magnetic annular protrusion 42, but if, as mentioned above, the outside diameter $D_0$ of the laminated silicon steel sheets constituting the main component 41 is made smaller than the outside diameter $D_1$ of the magnetic annular protrusion 42, then all or part of the non-magnetic annular support member 43 will naturally end up being disposed directly beneath the magnetic annular protrusion 42.

However, it will be possible to obtain the desired effect from the standpoint of reduced eddy current and residual magnetism if the material of the non-magnetic annular support member 43 is selected from among a resin, bakelite, FRP, or another such non-metal and has high electrical resistance.

In terms of the magnetic annular protrusion 52 and so forth, the pole piece 50 pertaining to the present invention and shown in FIGS. 3(a), (b), and (c) has the same structure as that shown in FIGS. 1(a), (b), and (c), except for the main component 51. Specifically, the pole piece 50 pertaining to the present invention and shown in FIGS. 3(a), (b), and (c) is formed such that a plurality of approximately disk-shaped laminated silicon steel sheets, which are fixed and supported by a non-magnetic annular support member 53 and constitute the main component 61, are laminated in the facing direction of the pole pieces and integrated with an insulating adhesive agent or the like. FIG. 3(c) is an oblique view illustrating the relationship of the lamination direction of the silicon steel sheets that constitute the main component 51, including a tiered protrusion 54.

With this structure, except for the tiered protrusion 64, there is no need to combine a plurality of laminated blocks as shown in FIG. 1, so not only is production easier, but mechanical strength is also better. Also, in order to further enhance the reduction in eddy current and residual magnetism, it is preferable for the laminated silicon steel sheets composed of this disk-shaped sheet material to be divided in the circumferential direction, and for semicircular, pie-shaped, or other such laminates to be combined.

In terms of the magnetic annular protrusion 62 and so forth, the pole piece 60 pertaining to the present invention and shown in FIGS. 4(a), (b), and (c) has the same structure as that shown in FIGS. 1(a), (b), and (c), except for the main component 61. Specifically, with the pole piece 60 pertaining to the present invention and shown in FIGS. 4(a), (b), and (c), an approximately disk-shaped laminate of silicon steel sheets, which is fixed and supported by a non-magnetic annular support member 63 and constitutes the main component 61, is formed by the disposition of a plurality of laminated blocks produced by laminating a plurality of silicon steel sheets in the direction perpendicular to the facing direction of the pole pieces and integrating these with an insulating adhesive agent or the like.

It is preferable, both from the standpoint of magnetic field uniformity and from the standpoint of mechanical strength, for the main component 61 to be such that the lamination direction is rotated by 90 degrees for every one of the small blocks that are laminated in the void-facing direction, as previously described for FIG. 17(c), and such that the lamination direction is rotated by 90 degrees for every one of the laminated blocks adjacent in the same plane. FIG. 4(c) is an oblique view illustrating the relationship of the lamination direction of the silicon steel sheets constituting the main component 61, including the tiered protrusion 64.

In terms of the magnetic annular protrusion 72 and so forth, the pole piece 70 pertaining to the present invention and shown in FIGS. 5(a), (b), and (c) has the same structure as that shown in FIGS. 1(a), (b), and (c), except for the main component 71. Specifically, with the pole piece 70 pertaining to the present invention and shown in FIGS. 5(a), (b), and (c), an approximately disk-shaped laminate of silicon steel sheets, which is fixed and supported by a non-magnetic annular support member 73 and constitutes the main component 71, is formed by the disposition of a plurality of laminated blocks produced by laminating a plurality of silicon steel bands in the direction perpendicular to the facing direction of the pole pieces and integrating these with an insulating adhesive agent or the like. FIG. 5(c) is an oblique view illustrating the relationship of the lamination direction of the silicon steel sheets constituting the main component 71, including the tiered protrusion 74.

In one method that can be employed to facilitate assembly and increase mechanical strength, a non-magnetic annular support member 73 in which a support 73a for the silicon steel sheets is provided to the edge on the inner periphery is readied, and strips of silicon steel sheets of varying length and having chamfers 71a formed corresponding to the shape of this support 73a are successively laid out and suspended, or are laid out and suspended after first being laminated for every few sheets and integrated into laminated rods.

It is also possible to laminate and integrate a plurality of strips of silicon steel sheets in one direction to produce a laminate of rectangular sheets, work this laminate into an approximate disk shape by water jet working or the like, and form a chamfer 71a corresponding to the shape of the support 73a of the non-magnetic annular support member 73 around the edge of this laminate.

The silicon steel sheets used here may be either directional silicon steel sheets or non-directional silicon steel sheets, but the use of non-directional silicon steel sheets is preferable from the standpoint of ease of manufacture. For example, there is no need to take directionality into account in the cutting of the various strips of silicon steel sheets that constitute the laminate into the required shapes.

In terms of the magnetic annular protrusion 82 and so forth, the pole piece 80 pertaining to the present invention and shown in FIGS. 6(a), (b), and (c) has the same structure as that shown in FIGS. 1(a), (b), and (c), except for the tiered protrusion 84. Specifically, with the pole piece 80 pertaining to the present invention and shown in FIGS. 6(a), (b), and (c), the tiered protrusion 84 formed on the side of the main component 81 facing the air gap has a structure in which there are disposed a plurality of laminated blocks produced by laminating a plurality of silicon steel sheets in the direction perpendicular to the facing direction of the pole pieces and then integrating these with an insulating adhesive agent or the like. FIG. 6(c) is an oblique view illustrating the relationship of the lamination direction of the silicon steel sheets constituting the main component 81, including the tiered protrusion 84.

It is preferable, both from the standpoint of magnetic field uniformity and from the standpoint of mechanical strength, for the approximately disk-shaped laminated silicon steel sheets that constitute the main component 81 to be disposed such that the lamination direction is rotated by 90 degrees for every one of the small blocks that are laminated in the void-facing direction, as previously described for FIG. 17(c), and such that the lamination direction is rotated by 90 degrees for every one of the laminated blocks adjacent in the same plane. 83 in the figure is a non-magnetic annular support member.

The silicon steel sheets constituting the tiered protrusion 84 may be either directional silicon steel sheets or non-directional silicon steel sheets, but the use of non-directional silicon steel sheets is preferable from the standpoint of ease of manufacture. For example, there is no need to take directionality into account in the cutting of the various pieces of silicon steel sheets that constitute the laminated blocks into the required shapes.

The pole pieces 50, 60, 70, and 80 pertaining to the present invention and described above are all the same as the pole pieces 40 pertaining to the present invention and shown in FIGS. 1(a), (b), and (c) in terms of the relationship between the main components 51, 61, 71, and 81 to the magnetic annular projection 52, 62, 72, and 82, so it is possible for the originally required field intensity to be efficiently generated in the specified air gap of the MRI magnetic field generator, and furthermore it is possible to achieve a reduction in eddy current and residual magnetism, without leading to a magnetically unsaturated state where the main components 51, 61, 71, and 81 and the magnetic annular projection 52, 62, 72, and 82 touch.

It has already been mentioned that it will be possible to obtain the desired effect from the standpoint of reduced eddy current and residual magnetism even if all or part of the non-magnetic annular support member is disposed directly beneath the magnetic annular protrusion with the above structure since the annular support member is made from a material with high electrical resistance, composed of a resin, bakelite, FRP, or another such non-metal.

Figure 10:
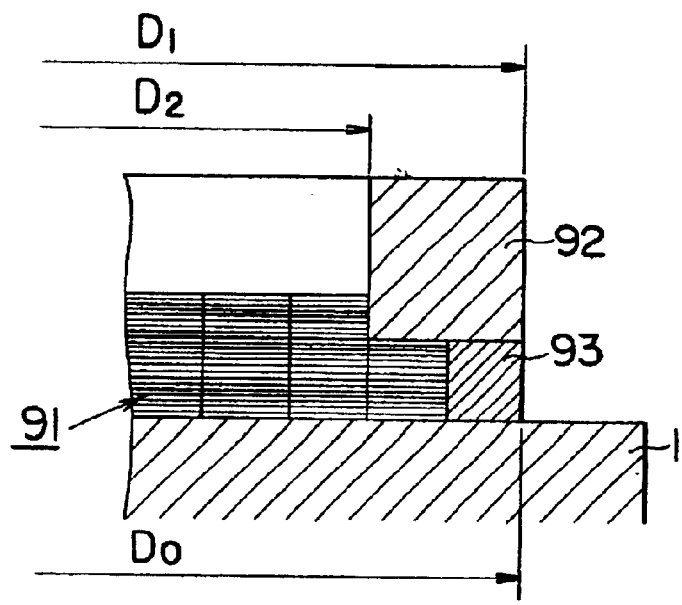
FIG. 10(a) is a vertical cross section illustrating a detail view of the MRI magnetic field generator pertaining to the present invention, and (b) is a top view.
Figure 10:
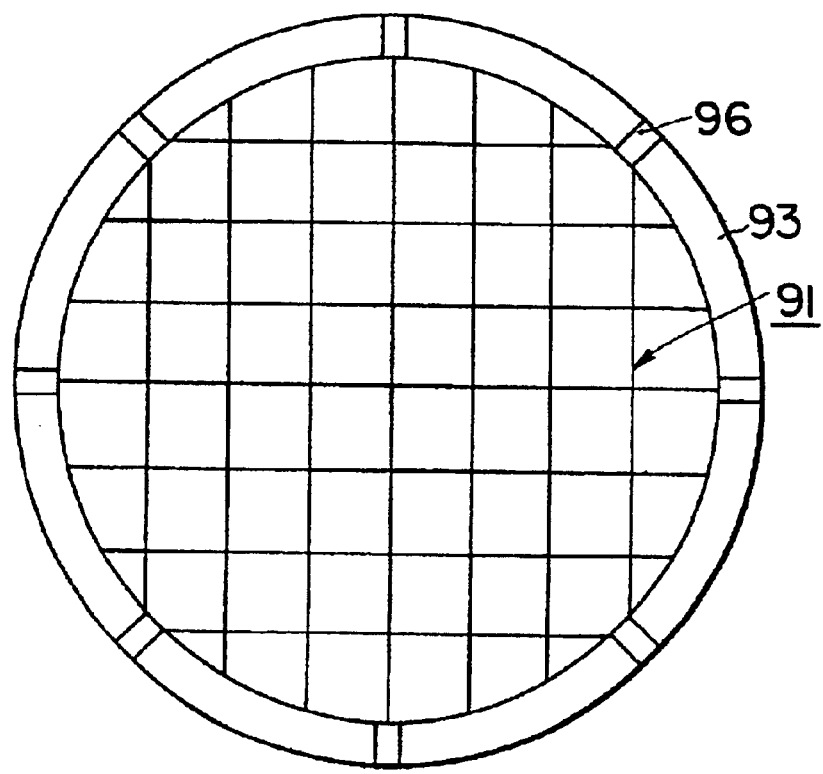
Figure 11:
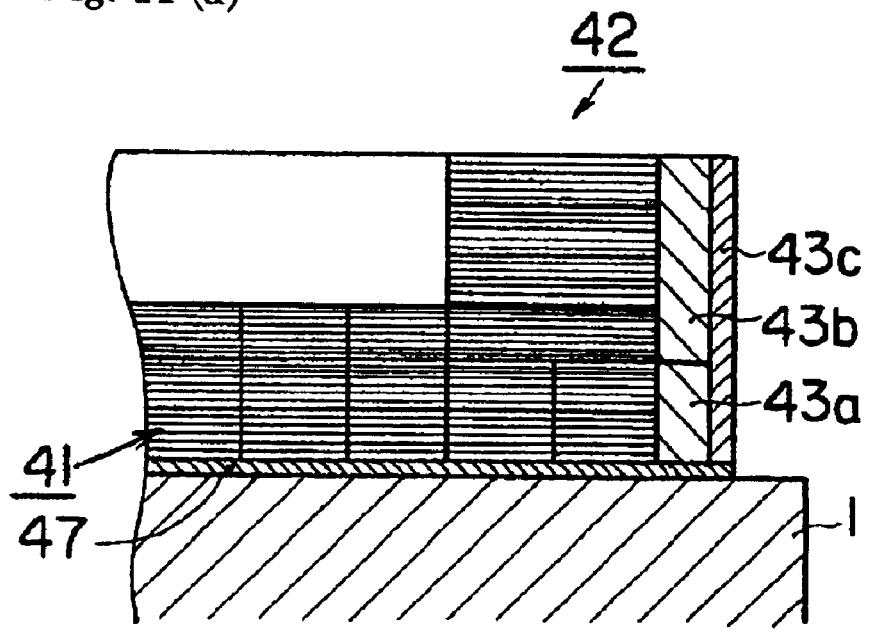
FIGS. 11(a) and (b) are vertical cross sections illustrating detail views of the MRI magnetic field generator pertaining to the present invention.
Figure 11:
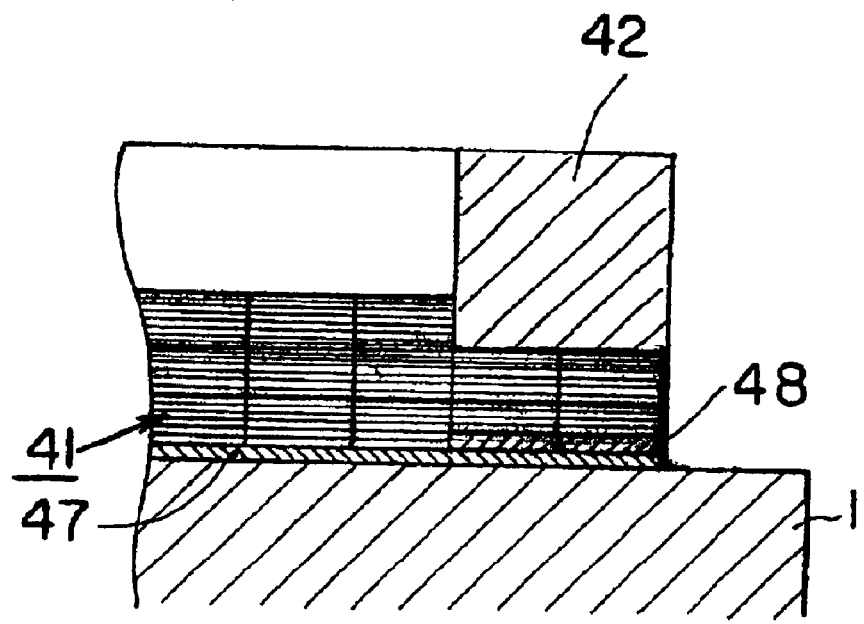

However, as shown in FIG. 10(*a*), from the standpoints of mechanical strength, workability, and so forth, the effect of reducing eddy current and residual magnetism is greatly diminished if all or part of a magnetic annular support member 93 is disposed directly beneath the magnetic annular protrusion 92 when soft iron or another such magnetic material is used for the annular support member that fixes and supports the main component 91.

The inventors have confirmed experimentally that this diminishment of the effect of reducing eddy current and residual magnetism can be suppressed by dividing the magnetic annular support member 93 into a plurality of sections, as shown in FIG. 10(*b*) (the figure shows a case of eight), in the circumferential direction with slits 96.

When the magnetic annular support member 93 is used, unlike when a non-magnetic annular support member was used, the magnetic annular support member 93 serves as a member that forms a magnetic path over which the magnetic flux produced by the magnetic field is transmitted from the permanent magnet structure 1 (the field generation source) to the annular protrusion, and it is therefore possible for the originally required field intensity to be efficiently generated in the specified air gap of the MRI magnetic field generator without the magnetic flux leading to a magnetically unsaturated state where the laminated silicon steel sheets and the magnetic annular protrusion touch.

Therefore, if we take into account the overall mechanical strength of the pole pieces, some of the factors for which are the shape and size and the lamination structure of the silicon steel sheets constituting the main component, as well as the effect of reducing eddy current and residual magnetism, and the magnetically unsaturated state where the main component and the magnetic annular protrusion touch, it is preferable for the annular support member to be made of a material selected from either a non-magnetic material with high electrical resistance and composed of a resin, bakelite, FRP, or another such non-metal, or a magnetic material such as soft iron, and it is particularly favorable to employ a structure in which this annular support member is divided into a plurality of sections in the circumferential direction as discussed above.

It is also possible to use a non-magnetic material composed of aluminum, copper, stainless steel, or another metal instead of the soft iron support member, but because these materials also have low electrical resistance, it is preferable to employ a structure in which there are a plurality of sections divided in the circumferential direction, just as with a soft iron support member.

For all of the above structures, the description was of one in which an annular support member was used, but the decision as to whether an annular support member is needed should be made according to the overall shape and size of the pole pieces, the shapes and sizes of the various laminated blocks of silicon steel sheets, their mutual adhesive strength, the mechanical strength of the pole pieces, which is naturally determined according to the integration method, that is, a method involving molding the entire pole piece from a resin, a method involving weaving in metal fibers, a method involving first placing and integrating on the permanent magnet structure or the like that will serve as the field generation source and then removing the jig, and so on, depending on whether the desired shape can be maintained by the attractive force from the field generation source when the field generation source is a permanent magnet structure, for example. It is further possible to use the above-mentioned non-magnetic annular support member together with a magnetic annular support member, in which case the shape of each is not limited to the structures shown in the figures.

The various support members, particularly when placed on the field generation source, are effective at ensuring the above-mentioned mechanical strength required of the pole pieces, but they are not necessarily required as long as the assembly of the magnetic field generator placed on the field generation source can be completed and the desired pole piece shape can be maintained, and when the relationship with other devices and the like disposed around the pole pieces is taken into account, these support members may be removed upon completion of the assembly. Also, in addition to whether or not there is an annular support member, the outer periphery of the main component does not necessarily have to be worked into an approximate disk shape, depending on the method for integrating the laminated blocks of silicon steel sheets.

Figure 7:
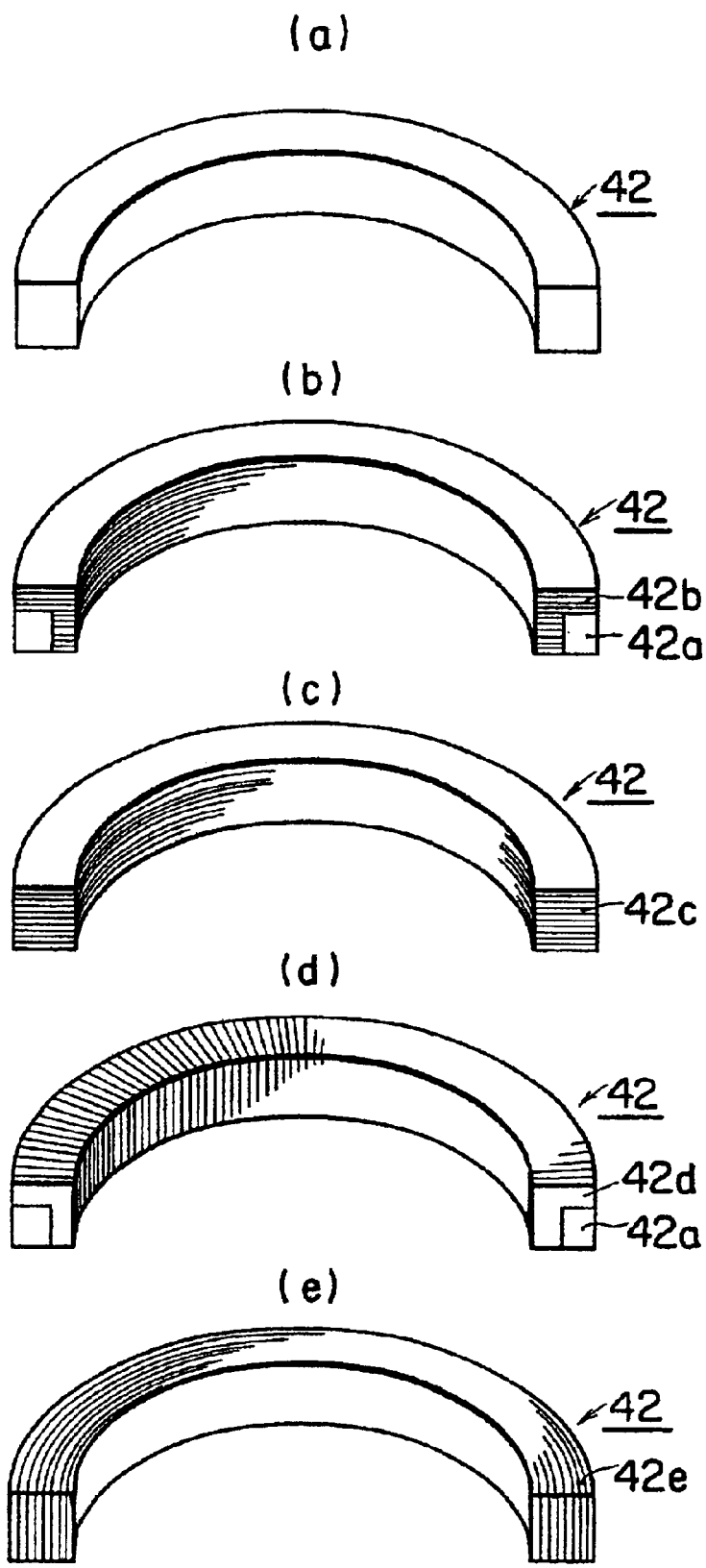
FIGS. 7(a), (b), (c), (d), and (e) are oblique views of the structure of the magnetic annular protrusion of the MRI magnetic field generator pertaining to the present invention.

In all of the above structures, a bulk magnetic material with a rectangular cross section was used as the annular protrusion placed on the side of the main component facing the air gap, but reducing the eddy current and residual magnetism in the annular protrusion is also effective in order to satisfy all of the characteristics required of an MRI magnetic field generator, and it is favorable for the entire annular protrusion, or just the surface layer thereof, to be constituted by a laminate of silicon steel sheets, as shown in FIG. 7. FIG. 7 is an oblique view of part of an annular protrusion divided in sections in the circumferential direction.

Specifically, FIG. 7(*a*) is the magnetic annular protrusion 42 in which only a bulk magnetic material with a rectangular cross section was used, whereas in FIG. 7(*b*) a bulk magnetic material 42*a* with a rectangular cross section is used as a core, with a laminate of silicon steel sheets 42*b* disposed around the periphery thereof, that is, laminated on the side facing the air gap and on the inner peripheral surface, in the direction facing the pole piece, so that only the surface layer of the annular protrusion is a laminate of silicon steel sheets.

In FIG. 7(*c*), the entire annular protrusion is constituted by a laminate of silicon steel sheets 42*c* laminated in the direction facing the pole piece. In FIG. 7(*d*), a bulk magnetic material 42*a* with a rectangular cross section is used as a core, with a laminate of silicon steel sheets 42*d* disposed around the periphery thereof (the side facing the air gap and on the inner peripheral surface), laminated in the direction perpendicular to the direction facing the pole piece. In FIG. 7(*e*), the entire annular protrusion is constituted by a laminate of silicon steel sheets 42*e*, laminated concentrically and in the direction perpendicular to the direction facing the pole piece.

Figure 9:
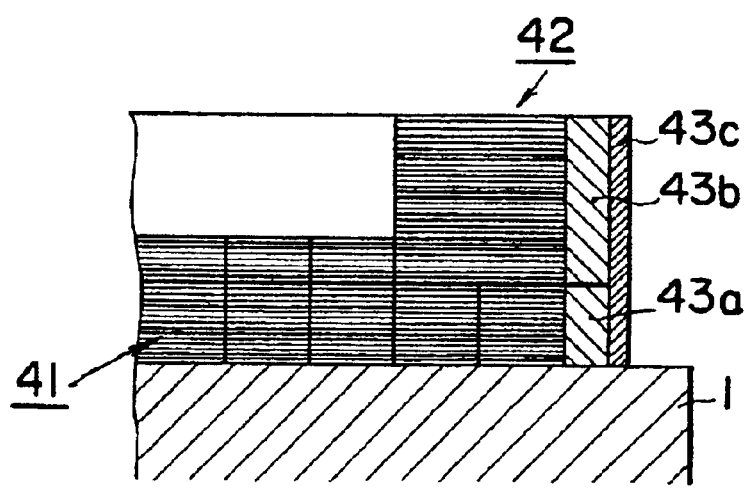
FIG. 9 is a vertical cross section illustrating a detail view of the MRI magnetic field generator pertaining to the present invention.

In FIG. 9, a magnetic annular protrusion 42 with the structure in FIG. 1 is changed to the structure in FIG. 7(*c*) discussed above, which makes possible a reduction in eddy current and residual magnetism in this magnetic annular protrusion 42, and allows the characteristics of the overall pole piece to be greatly enhanced.

With this structure, since the magnetic annular protrusion 42 is also formed from a laminate of silicon steel sheets, the mechanical strength of the pole pieces overall is somewhat inferior to that of the structure in FIGS. 1(a), (b), and (c). Therefore, it is possible to enhance the mechanical strength of the pole pieces overall by disposing the non-magnetic annular support members 43a and 43b around the peripheral edges of the laminated silicon steel sheets constituting the main component 41 and around the peripheral edge of the magnetic annular protrusion 42, then disposing the non-magnetic annular support member 43c so as to integrally enclose these, and then performing resin molding.

Also, because the pole pieces constituting the magnetic field generator of the present invention are substantially constituted by a plurality of laminated blocks of silicon steel sheets, in order to increase the mechanical strength of the pole pieces overall, it is also effective to adhesively fix a magnetic lamina 47 to the bottoms of the pole pieces, that is, to the side of the main component 41 composed of a laminate of silicon steel sheets that is opposite the side facing the air gap, as shown in FIG. 11(a), although this will somewhat diminish the original effect of reducing eddy current and residual magnetism.

This magnetic lamina 47 makes it possible to increase the bonded surface area of the individual laminated blocks of silicon steel sheets and prevent their lateral shift respective to one another. However, the desired effect of reducing eddy current and residual magnetism will not be obtained if this magnetic lamina 47 is thicker than necessary.

It is therefore preferable for the magnetic lamina 47 to be extremely thin, and should be no more than 10% of the thickness of the main component comprising a laminate of silicon steel sheets (when a tiered protrusion is provided, the thickness including this tiered protrusion). The mechanical strength of the pole pieces can be ensured by setting the thickness of the magnetic lamina at no more than 3% of the thickness of the main component, but a thickness of about 5% is also effective from the standpoint of handling when we consider such factors as integration with the magnetic annular protrusion and other members with screws.

Again when the above magnetic lamina is used, it is preferable from the standpoint of reducing eddy current and residual magnetism to divide the magnetic lamina into a plurality of sections in the circumferential direction and combine these semi-circular, pie-shaped, or other sections.

In order to integrate the magnetic annular protrusion and the main component with screws, as shown in FIG. 11(b), a flat ring-shaped magnetic plate 48 (no more than 20%, and preferably no more than 15%, of the thickness of the main component 41) divided into a plurality of sections in the circumferential direction may be disposed at a position corresponding to the peripheral edge of the magnetic lamina 47 directly beneath the magnetic annular protrusion 42, which is relatively susceptible to the effect of the magnetic field generated by the Gradient magnetic field coils.

Furthermore, it is also possible to employ a structure in which a non-magnetic lamina with high electrical resistance, such as a resin, bakelite, or FRP, in place of the above-mentioned magnetic lamina 47. This disposition of a non-magnetic lamina will not result in the generation of an eddy current or residual magnetism, and while the thickness thereof can be selected as desired, excessive thickness will prevent the efficient formation of the magnetic field generated from the field generation source within the air gap.

Therefore, when a non-magnetic lamina is disposed in a structure in which a permanent magnet structure is used as the field generation source, it is favorable for the permanent magnets to have higher magnetic characteristics than usual, or for the volume of the permanent magnet structure to be increased somewhat.

Also, with a structure in which an electromagnetic coil is used as the field generation source, it is preferable for the current applied to the electromagnetic coil to be increased somewhat.

The MRI magnetic field generator of the present invention is not limited to a structure in which permanent magnets such as R-Fe-B-based magnets are used as the field generation source, and also encompasses structures such as one in which an electromagnetic coil (including normal conduction coils, superconduction coils, and so on) is wound around an iron core, but in order for the advantages of constituting the main component of the pole pieces from a laminate of silicon steel sheets to be utilized most effectively, it is preferable to use a structure in which permanent magnets with a substantially high electrical resistance and low magnetic permeability are employed.

Specifically, a preferred structure is one in which the main component of the pole pieces is placed on the permanent magnet structure serving as the field generation source. Also, with a structure in which a non-magnetic lamina with high electrical resistance is disposed on the surface of the pole piece main component on the side opposite the side facing the air gap, the advantages of the pole piece structure of the present invention can be effectively utilized even when an electromagnetic coil is wound around an iron core.

In addition, with the magnetic field generator of the present invention, it is possible to employ known technology as needed, without being restricted to the structures illustrated in the figures.

EMBODIMENTS

Embodiment 1

To confirm the effect of the MRI magnetic field generator of the present invention, its effect of reducing eddy current and residual magnetism was evaluated by the following method. A tilt field coil was installed on various types of pole piece, a pulse current (500 AT) consisting of a specific pulse (1 msec, 3 msec, or 5 msec) was applied to the field coil, and the magnitude of the residual magnetism was measured with a milligauss meter. The measurement results are given in Tables 1 and 2.

The pole piece main component had an outside diameter of 1000 mm and a thickness of 60 mm (maximum thickness including the tiered protrusion). The annular protrusion had an outside diameter of 1000 mm, and inside diameter of 920 mm, and a thickness of 50 mm, and was installed around the peripheral edge of the pole piece main component. An FRP (glass fiber-reinforced plastic) support member had an outside diameter of 1040 mm, an inside diameter of 1000 mm, and a thickness of 50 mm, and an iron support member had an outside diameter of 1000 mm, an inside diameter of 960 mm, and a thickness of 50 mm.

Because it is usually extremely difficult to measure the eddy current itself flowing through a metal, the magnitude of the eddy current was evaluated from the amount of change in residual magnetism when the pulse width was varied. The values in the table indicate the difference between residual magnetism at 1 msec and the residual magnetism at 5 msec. Specifically, a short pulse width corresponds to a high frequency, whereas a long pulse width corresponds to a low frequency. The fact that the amount of residual magnetism changed with the pulse width means that there is a dependence on frequency. Therefore, if there is a large amount of change, there is also a large eddy current, the result of which is that a sharp image cannot be obtained.

Figure 15:
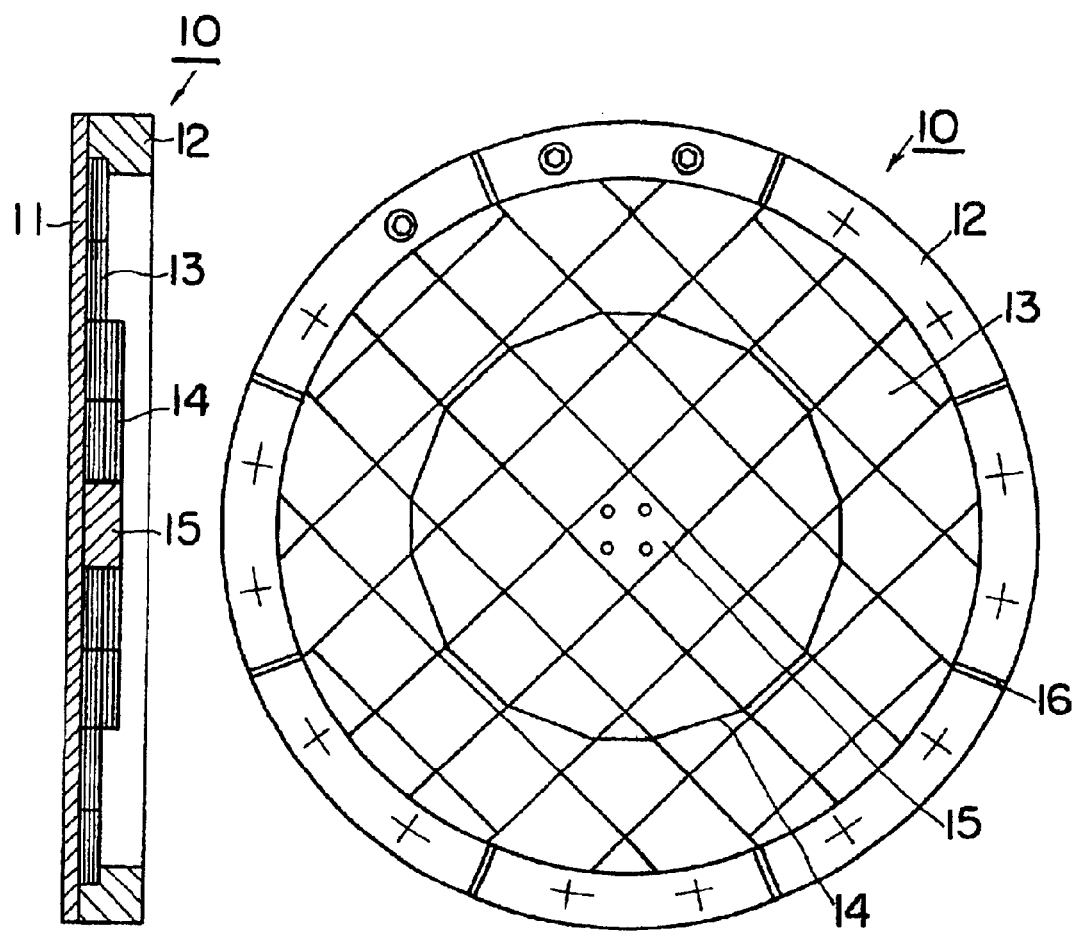
FIG. 15 is a diagram illustrating another structure of a conventional MRI magnetic field generator, with (a) being a vertical cross section and (b) a front view.

The pole pieces A to E of the present invention can be seen to have less residual magnetism at all pulse widths, and to have less change in the residual magnetism, than pole pieces with the conventional structure shown in FIG. 15, that is, a structure in which a magnetic base member composed of bulk iron with a thickness of 30 mm is disposed in the pole piece main component. In particular, pole piece B, in which FRP was used as the support member and the annular protrusion comprised laminated silicon steel sheets, had a lower value for residual magnetism than the other structures and had an extremely small amount of change in residual magnetism, so it can be seen that the effect of reducing eddy current and residual magnetism is extremely good here.

When iron was used as a support member, and when this support member was in a so-called bulk form and not divided (reference example), even when a laminate of silicon steel sheets was used for the pole piece main component, the effect thereof could not be effectively utilized, and it can be seen that the effect of the iron support member positioned directly beneath the annular protrusion resulted in residual magnetism and eddy current that were either the same as or worse than those in a conventional structure.

However, the effect of using a laminate of silicon steel sheets for the pole piece main component can be effectively realized by dividing the support member, as shown by pole piece C, or by using laminated silicon steel sheets as the annular protrusion, as shown by pole piece D.

Figure 3:
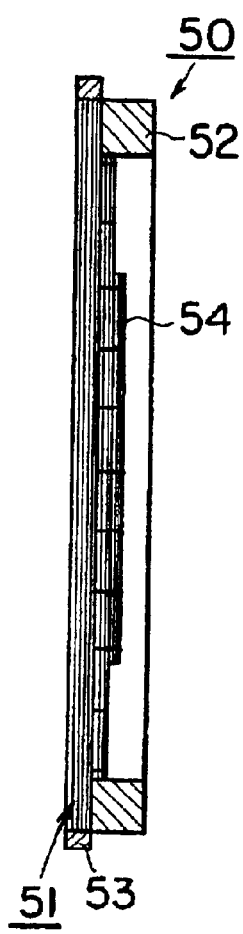
FIG. 3 is a diagram illustrating another structure of the MRI magnetic field generator pertaining to the present invention, with (a) being a vertical cross section, (b) a top view, and (c) an oblique view of the main component.
Figure 3:
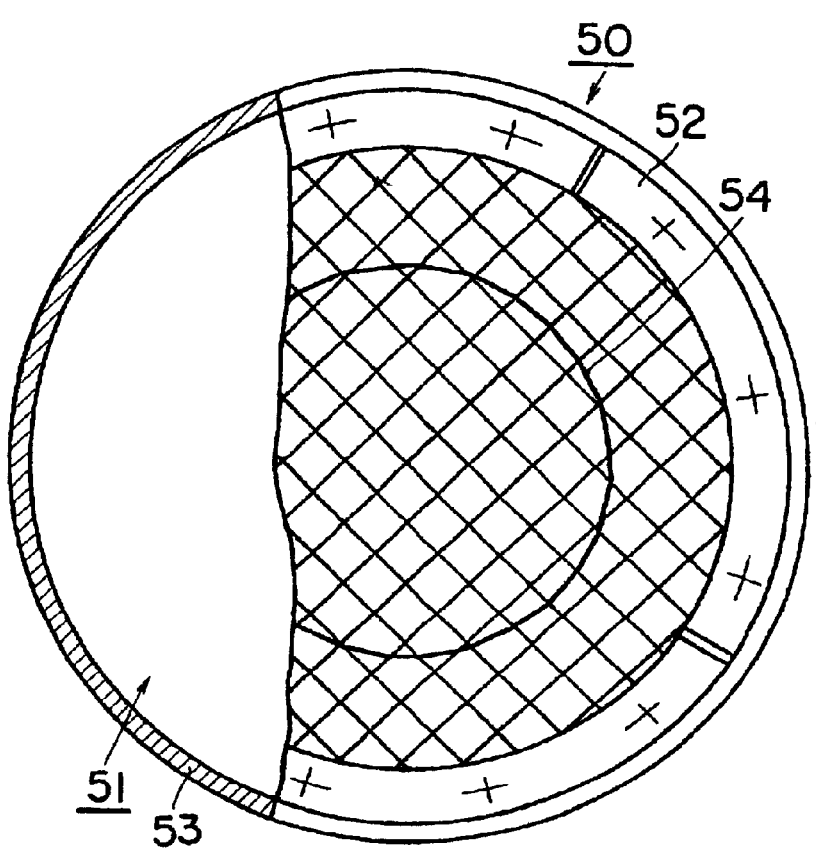
Figure 3:
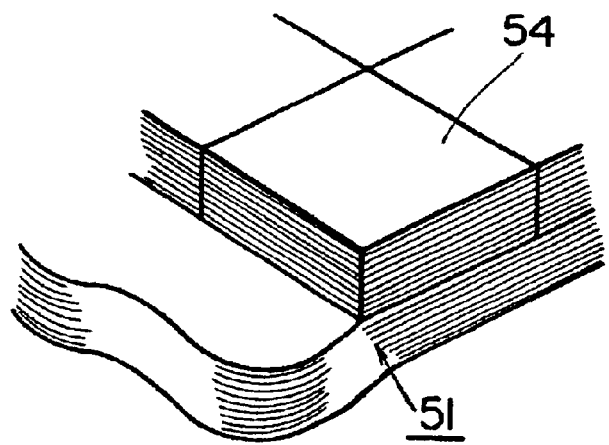
Figure 4:
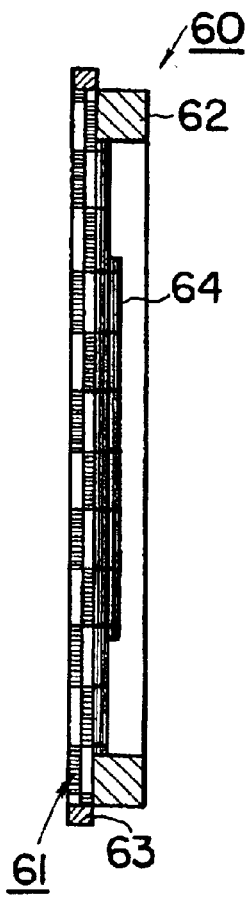
FIG. 4 is a diagram illustrating another structure of the MRI magnetic field generator pertaining to the present invention, with (a) being a vertical cross section, (b) a top view, and (c) an oblique view of the main component.
Figure 4:
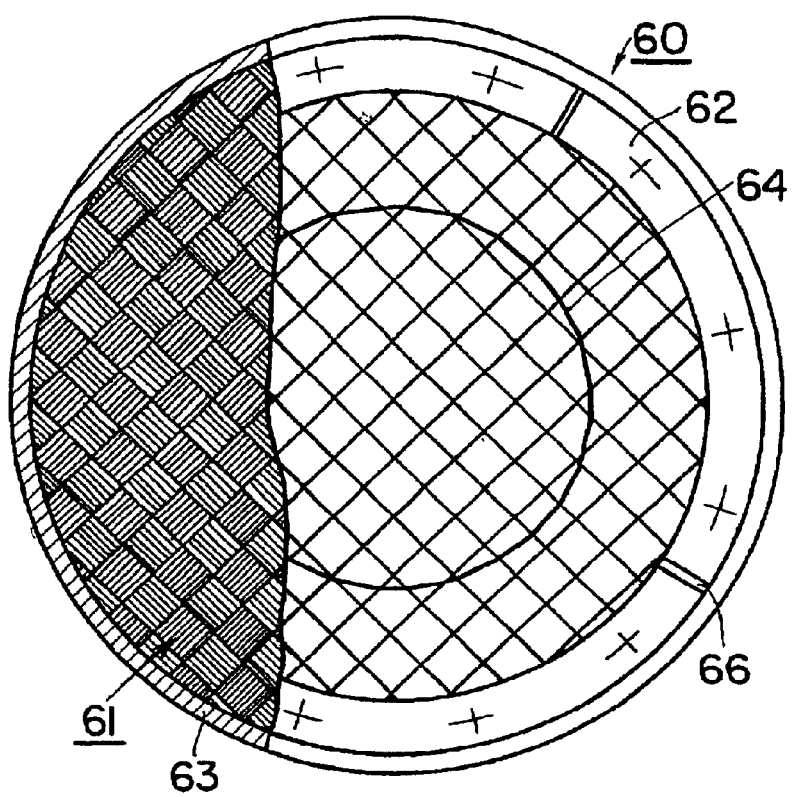
Figure 4:
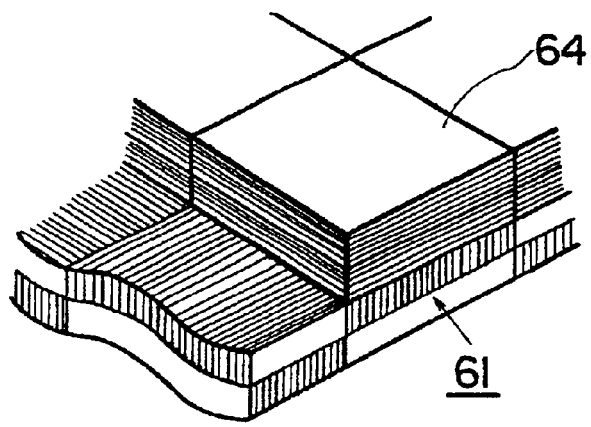
Figure 6:
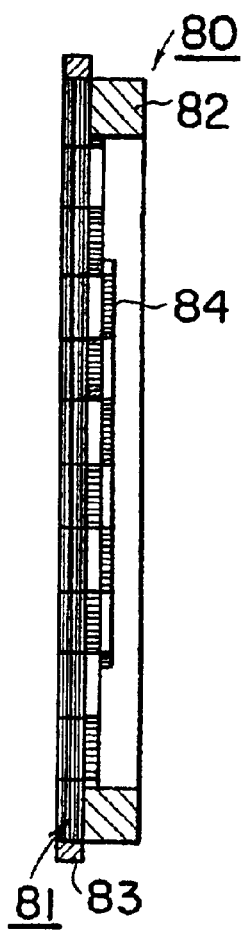
FIG. 6 is a diagram illustrating another structure of the MRI magnetic field generator pertaining to the present invention, with (a) being a vertical cross section, (b) a top view, and (c) an oblique view of the main component.
Figure 6:
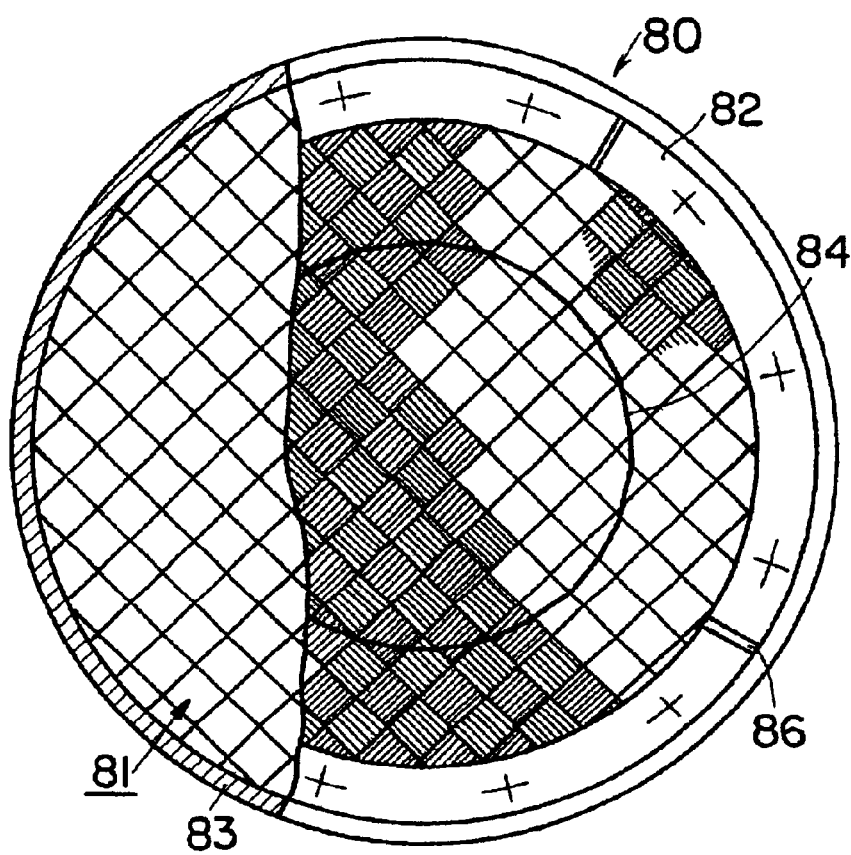
Figure 6:
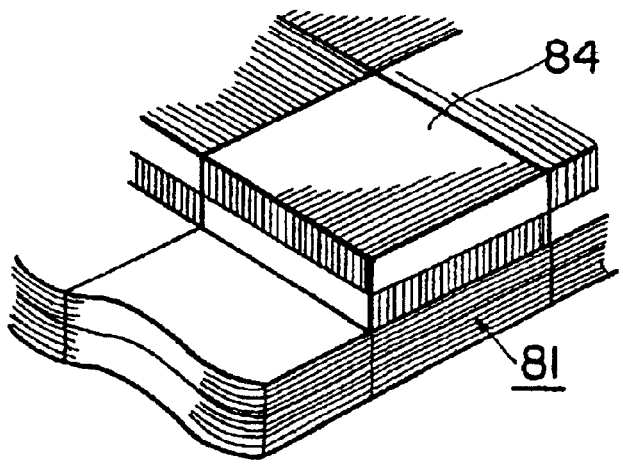

Pole piece E had a structure in which laminated silicon steel sheets were used as the annular protrusion in addition to the structure shown in FIG. 3, and while the effect of reducing residual magnetism and eddy current was somewhat lower than with the other pole pieces A to D, it was still clearly superior to that of the pole piece with a conventional structure. An effect equal to or better than the effect shown for pole piece E is obtained with all of the structures of the present invention shown in FIGS. 4 to 6.

When the same measurements were made for a structure in which a magnetic lamina with a thickness of 1.5 mm was further used with pole piece B (see FIG. 11), the magnetic lamina had almost no effect on eddy current and residual magnetism, and the measurement results were about the same as those for pole piece B.

TABLE 1

| Structure reference figure | Annular projection | | Support member | |
|---|---|---|---|---|
| | Material | Divisions in circumferential direction | Material | Divisions in circumferential direction |
| Conventional example Comparison | | | | |
| FIG. 15 | iron | 8 divisions | none | — |
| FIG. 10 Present invention | iron | 8 divisions | iron | none |
| A FIG. 1 | iron | 8 divisions | FRP | — |
| B FIG. 9 | laminated silicon steel sheets | 8 divisions | FRP | — |
| C FIG. 10 | iron | 8 divisions | iron | 8 divisions |
| D FIG. 10 | laminated silicon steel sheets | 8 divisions | iron | 8 divisions |
| E FIG. 3 | laminated silicon steel sheets | 8 divisions | FRP | — |

TABLE 2

| Structure reference figure | Residual magnetism measurement results | | | Eddy current evaluation* |
|---|---|---|---|---|
| | 1 msec | 3 msec | 5 msec | |
| Conventional example Comparison | | | | |
| FIG. 15 | 95 | 63 | 49 | 46 |
| FIG. 10 Present invention | 101 | 60 | 48 | 53 |
| A FIG. 1 | 36 | 26 | 24 | 12 |
| B FIG. 9 | 22 | 21 | 20 | 2 |
| C FIG. 10 | 54 | 29 | 22 | 32 |
| D FIG. 10 | 39 | 27 | 23 | 16 |
| E FIG. 3 | 75 | 52 | 36 | 39 |

*Eddy current evaluation: (residual magnetism at 1 msec) − (residual magnetism at 5 msec)

Embodiment 2

Figure 12:
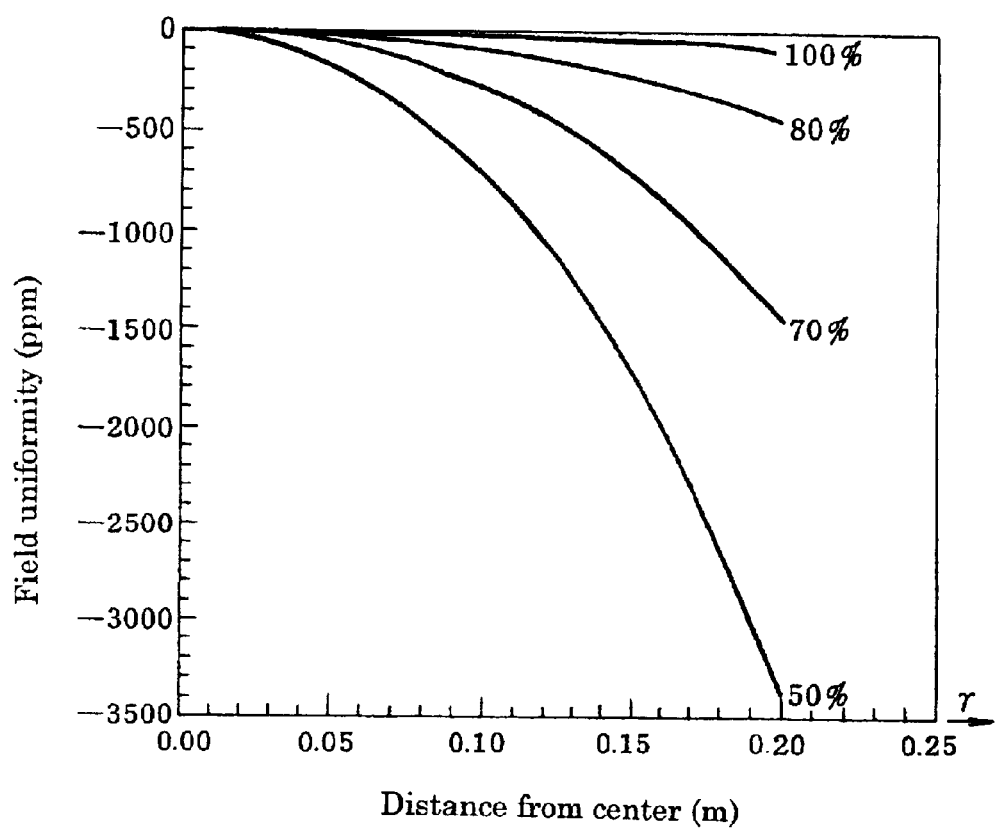
FIG. 12 is a graph of the relationship between magnetic field uniformity and distance from the center in the air gap.
Figure 13:
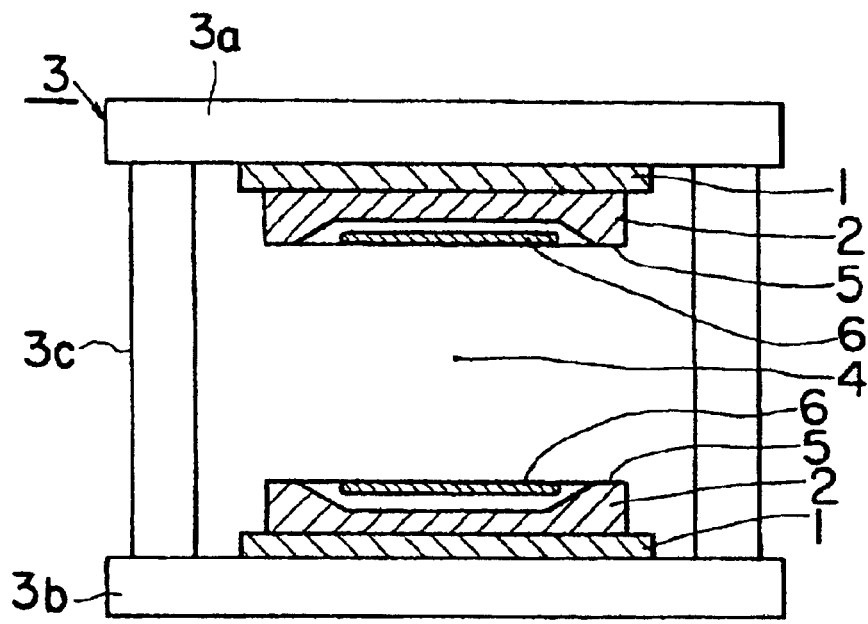
FIG. 13 is a diagram illustrating the structure of a conventional MRI magnetic field generator, with (a) being a front view and (b) a lateral cross section.
Figure 13:
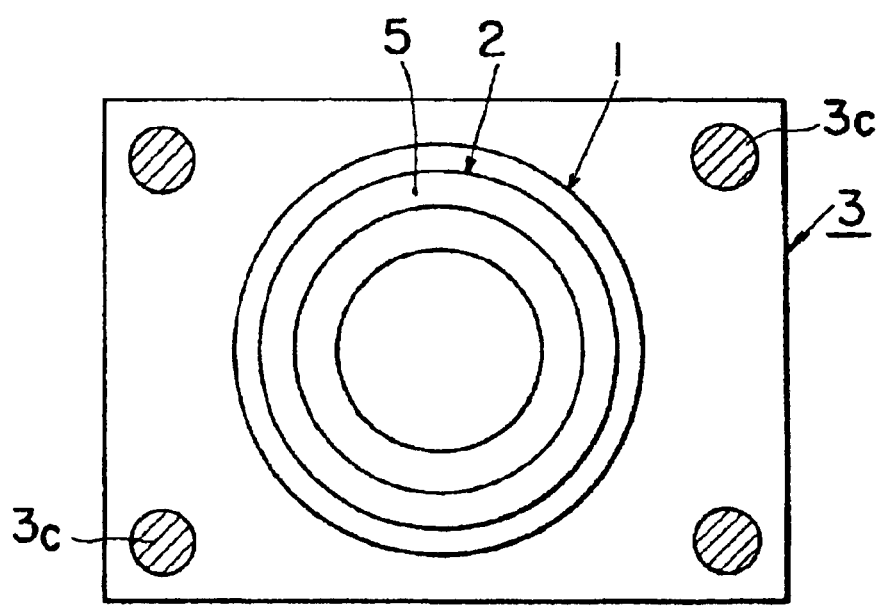
Figure 14:
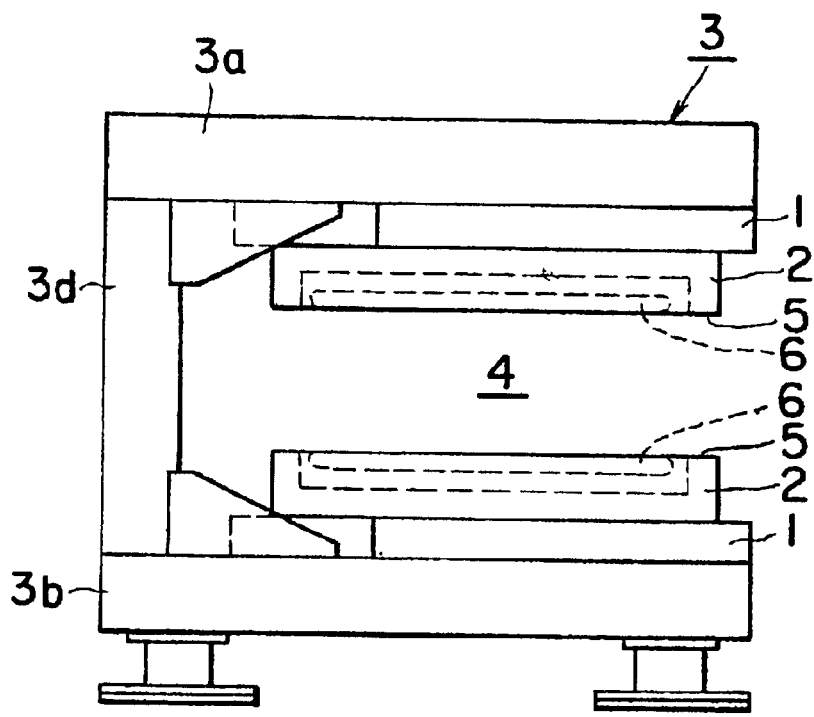
FIG. 14 is a diagram illustrating another structure of a conventional MRI magnetic field generator, with (a) being a front view and (b) a lateral cross section.
Figure 14:
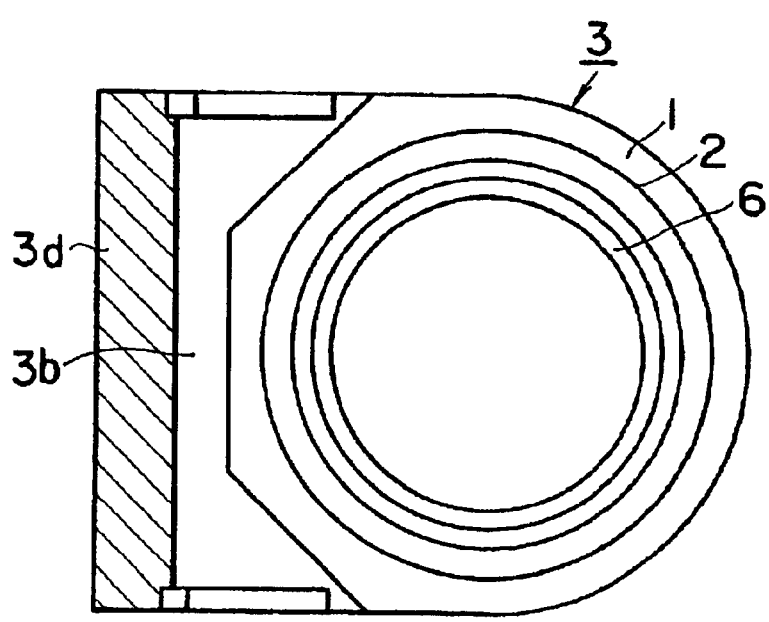

FIG. 12 is a graph of the results of measuring the effect that the surface area ratio of the portion where the annular protrusion is in contact with the pole piece main component disposed directly therebelow has on the magnetic field uniformity in the air gap of an MRI magnetic field generator (in which a permanent magnet structure comprising R-Fe-B-based magnets is used as the field generation source) (the structure in FIG. 1 was employed for the pole pieces). Specifically, the horizontal axis is the distance in the radial direction from the center of the air gap of the MRI magnetic field generator, and the vertical axis is the magnetic field uniformity in this air gap.

The curves in the graph, from the top, indicate when the above-mentioned surface area ratio was 100%, 80%, 70%, and 60%. Specifically, it can be seen that there is a pronounced drop in magnetic field uniformity as the surface area of the portion where the pole piece main component touches the annular protrusion becomes smaller.

It is possible for the above-mentioned surface area ratio to be 80% or higher in the present invention, and it was found that the effect discussed above for reducing residual magnetism and eddy current can still be obtained without leading to a drop in magnetic field uniformity.

Industrail Applicability

As is clear from the examples, because the MRI magnetic field generator of the present invention makes use of pole pieces in which a main component comprising a laminate of silicon steel sheets is effectively combined with an annular protrusion disposed on the side of the main component facing the air gap, a static magnetic field having the desired uniformity can be formed in the air gap, and eddy current and residual magnetism within the pole pieces, which are generated due to the effect of the pulse current flowing through the Gradient magnetic field coils, can be reduced without leading to a magnetically unsaturated state in the vicinity of the annular protrusion.

What is claimed is:

1. An MRI magnetic field generator comprising: a yoke;
a pair of pole pieces disposed facing each other so as to form an air gap therein between; and
a pair of permanent magnets supported by the yoke, said permanent magnets for generating a magnetic field in the air gap, each permanent magnet having opposite ends, one end of each permanent magnate disposed facing the air gap and being directly attached to the pole piece, and the opposite lens facing the yoke;
the pole pieces being formed of a main component including a plurality of laminated blocks, each comprising a plurality of laminated silicon steel sheets, wherein the laminated blocks of the silicon steel sheets are laminated in a direction facing the pole pieces, and a magnetic annular protrusion disposed on a side of the main component facing the air gap; wherein the magnetic annular protrusion has a side with a surface area Sa facing the main component and has a surface area Sb facing the magnetic annular protrusion and wherein the ratio of Sb/Sa is at least 80% or higher.

2. The MRI magnetic filed generator according to claim 1, further including a non-magnetic support member with high electrical resistance secured to on the side second proximate to the yoke for supporting said main component.

3. The MRI magnetic field generator according to claim 2, wherein said non-magnetic support member comprises a resin, bakelite, FRP, or another such non-metal.

4. The MRI magnetic field generator according to claim 1, further comprising magnetic annular support member divided into a plurality of sections in the circumferential direction secured to a perpetual portion of the main component.

5. The MRI magnetic field generator according to claim 1, wherein said magnetic annular protrusion comprises laminated silicon steel sheets.

6. The MRI magnetic field generator according to claim 5, wherein said main component and magnetic annular protrusion comprises silicon steel sheets laminated in the direction facing the pole pieces.

* * * * *